US012677641B2

(12) United States Patent
Jung et al.

(10) Patent No.:  US 12,677,641 B2
(45) Date of Patent:       Jul. 7, 2026

(54) SEMICONDUCTOR DEVICE

(71) Applicant: SAMSUNG ELECTRONICS CO., LTD., Suwon-si (KR)

(72) Inventors: Il Geun Jung, Suwon-si (KR); Sung Jin Kim, Suwon-si (KR); Sang-Ki Kim, Suwon-si (KR); Joong Won Shin, Suwon-si (KR); Sung Yun Woo, Suwon-si (KR); Sang Hyeon Jeon, Suwon-si (KR); Ji Min Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 811 days.

(21) Appl. No.: 17/987,132

(22) Filed: Nov. 15, 2022

(65) Prior Publication Data

US 2023/0317532 A1      Oct. 5, 2023

(30) Foreign Application Priority Data

Mar. 30, 2022    (KR) ........................ 10-2022-0039693

(51) Int. Cl.
| | |
|---|---|
| *H10P 74/00* | (2026.01) |
| *H10W 70/65* | (2026.01) |
| *H10W 72/20* | (2026.01) |
| *H10W 72/29* | (2026.01) |
| *H10W 72/90* | (2026.01) |
| *H10W 90/00* | (2026.01) |

(52) U.S. Cl.
CPC ........... *H10P 74/273* (2026.01); *H10W 90/00* (2026.01); *H10W 70/65* (2026.01); *H10W*

*72/252* (2026.01); *H10W 72/29* (2026.01); *H10W 72/967* (2026.01)

(58) Field of Classification Search
CPC ........................................................ H01L 22/32
See application file for complete search history.

(56) References Cited

U.S. PATENT DOCUMENTS

| | | | | |
|---|---|---|---|---|
| 6,251,694 B1 * | 6/2001 | Liu | ........................ | H10P 74/23 |
| | | | | 257/E23.021 |
| 6,429,532 B1 * | 8/2002 | Han | ...................... | H10W 72/20 |
| | | | | 257/781 |
| 6,441,487 B2 * | 8/2002 | Elenius | ................. | G06F 1/1601 |
| | | | | 257/738 |

(Continued)

FOREIGN PATENT DOCUMENTS

| | | |
|---|---|---|
| JP | 2002-090422 A | 3/2002 |
| KR | 10-2007-0009973 A | 1/2007 |
| KR | 1020150128919 A | 11/2015 |

*Primary Examiner* — William A Harriston
(74) *Attorney, Agent, or Firm* — Muir Patent Law, PLLC

(57) ABSTRACT

A semiconductor device includes a substrate with first and second surfaces, a first test pad on the first surface of the substrate, a first bump pad on the first surface of the substrate and spaced apart from the first test pad in a first direction, a second bump pad on the first surface of the substrate and spaced apart from the first bump pad, a second test pad on the first surface of the substrate and spaced apart from the second bump pad in the first direction, a first wiring layer in the first direction and electrically connecting the first test pad to the first bump pad, a second wiring layer in the first direction, spaced apart from the first wiring layer, and electrically connecting the second test pad to the second bump pad, and a first bump connected to each of the first and second bump pads.

22 Claims, 19 Drawing Sheets

(56)         References Cited

U.S. PATENT DOCUMENTS

| | | | | |
|---|---|---|---|---|
| 6,534,853 B2 * | 3/2003 | Liu | H10P 74/277 | |
| | | | 257/691 | |
| 7,235,412 B1 * | 6/2007 | Mardi | H10P 74/273 | |
| | | | 438/18 | |
| 7,282,375 B1 * | 10/2007 | Kelkar | H10P 74/207 | |
| | | | 257/E21.531 | |
| 7,394,161 B2 * | 7/2008 | Kuo | H10P 74/273 | |
| | | | 257/784 | |
| 7,901,956 B2 * | 3/2011 | Kuan | H10P 74/277 | |
| | | | 257/E23.021 | |
| 9,129,816 B2 * | 9/2015 | Chen | H10P 74/277 | |
| 9,142,522 B2 * | 9/2015 | Bao | H10W 72/20 | |
| 9,818,710 B2 * | 11/2017 | Kang | H10W 72/012 | |
| 11,967,572 B2 * | 4/2024 | Jensen | H10W 72/90 | |
| 2002/0180026 A1 * | 12/2002 | Liu | H10P 74/277 | |
| | | | 257/773 | |
| 2006/0060961 A1 * | 3/2006 | Lin | H10W 72/20 | |
| | | | 257/737 | |
| 2007/0020916 A1 * | 1/2007 | Farnworth | H10W 72/20 | |
| | | | 257/E23.021 | |
| 2007/0132108 A1 * | 6/2007 | Lee | H10W 72/20 | |
| | | | 257/E23.021 | |
| 2007/0221920 A1 * | 9/2007 | Mardi | H10P 74/273 | |
| | | | 257/48 | |
| 2008/0042275 A1 * | 2/2008 | Kuan | H10P 74/277 | |
| | | | 257/738 | |
| 2008/0050909 A1 * | 2/2008 | Lin | H10W 20/01 | |
| | | | 257/E21.575 | |
| 2008/0061436 A1 * | 3/2008 | Yang | H10W 72/20 | |
| | | | 257/E23.021 | |
| 2011/0204357 A1 * | 8/2011 | Izuha | G01R 31/2853 | |
| | | | 438/18 | |
| 2013/0134580 A1 * | 5/2013 | Bao | H10W 72/20 | |
| | | | 257/737 | |
| 2013/0240883 A1 * | 9/2013 | Chen | H10P 74/277 | |
| | | | 257/E21.59 | |
| 2015/0228594 A1 * | 8/2015 | Alvarado | H10W 72/90 | |
| | | | 257/737 | |
| 2021/0280476 A1 * | 9/2021 | Min | H10P 74/273 | |
| 2022/0005782 A1 * | 1/2022 | Rodriguez | H10W 72/075 | |
| 2022/0223550 A1 * | 7/2022 | Chen | H10W 72/90 | |
| 2024/0030173 A1 * | 1/2024 | Fang | H10W 70/09 | |

* cited by examiner

SEMICONDUCTOR DEVICE

CROSS-REFERENCE TO RELATED APPLICATION

This application claims priority from Korean Patent Application No. 10-2022-0039693, filed on Mar. 30, 2022, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor device.

2. Description of the Related Art

Recently, as a semiconductor device has become lighter, thinner, and smaller, an external terminal that connects the semiconductor device to an external power source or another semiconductor device is also being reduced in size. Stable implementation of the external terminal helps achieve a reliable semiconductor package fabricated using a semiconductor device. Accordingly, in order to improve the reliability of an external terminal through which electrical signals are exchanged between the semiconductor device and an external device, various studies are being conducted.

SUMMARY

According to some embodiments of the present disclosure, there is provided a semiconductor device, including a first substrate including a first surface and a second surface opposed to the first surface, a first test pad disposed on the first surface of the first substrate, a first bump pad disposed on the first surface of the first substrate and spaced apart from the first test pad in a first horizontal direction, a second bump pad disposed on the first surface of the first substrate and spaced apart from the first bump pad, a second test pad disposed on the first surface of the first substrate and spaced apart from the second bump pad in the first horizontal direction, a first wiring layer extending in the first horizontal direction and configured to electrically connect the first test pad to the first bump pad, a second wiring layer extending in the first horizontal direction, spaced apart from the first wiring layer, and configured to electrically connect the second test pad to the second bump pad, and a first bump connected to each of the first and second bump pads.

According to some embodiments of the present disclosure, there is provided a semiconductor device, including a first substrate including a substrate including a first surface and a second surface opposed to the first surface, first and second wiring layers extending in a first horizontal direction on the first surface of the substrate and spaced apart from each other, a passivation layer configured to cover the first and second wiring layers on the first surface of the substrate, a first trench formed inside the passivation layer on the first wiring layer, a second trench formed inside the passivation layer on the first wiring layer and spaced apart from the first trench in the first horizontal direction, a third trench formed inside the passivation layer on the second wiring layer and spaced apart from the second trench, a fourth trench formed inside the passivation layer on the second wiring layer and spaced part from the third trench in the first horizontal direction, a first test pad defined by a portion of the first wiring layer exposed by the first trench, a first bump pad defined by another portion of the first wiring layer exposed by the second trench and connected to the first test pad through the first wiring layer, a second bump pad defined by a portion of the second wiring layer exposed by the third trench, a second test pad defined by another portion of the second wiring layer exposed by the fourth trench, and a first bump at least partially disposed inside each of the second and third trenches and connected to each of the first and second bump pads, wherein the first bump pad and the first test pad are electrically connected to each other through the first wiring layer, and the second bump pad and the second test pad are electrically connected to each other through the second wiring layer.

According to some embodiments of the present disclosure, there is provided a semiconductor device, including a substrate including a first surface and a second surface opposed to the first surface, first and second wiring layers extending in a first horizontal direction on the first surface of the substrate and spaced apart from each other in a second horizontal direction that is different from the first horizontal direction, a passivation layer configured to cover the first and second wiring layers on the first surface of the substrate, a first test pad disposed inside the first wiring layer, a first bump pad disposed inside the first wiring layer and spaced apart from the first test pad in the first horizontal direction, a second test pad disposed inside the second wiring layer and spaced apart from the first test pad in the second horizontal direction, a second bump pad disposed inside the second wiring layer, spaced apart from the second test pad in the first horizontal direction, and spaced apart from the first bump pad in the second horizontal direction, a bump connected to each of the first and second bump pads, and a photosensitive layer configured to surround sidewalls of the bump on the passivation layer, wherein an upper surface of the first wiring layer is formed at a same level as each of an upper surface of the first test pad and an upper surface of the first bump pad, an upper surface of the second wiring layer is formed at a same level as each of an upper surface of the second test pad and an upper surface of the second bump pad, a width of the first test pad in the first horizontal direction is greater than a width of the first bump pad in the first horizontal direction, the first bump pad and the first test pad are electrically connected to each other through the first wiring layer, and the second bump pad and the second test pad are electrically connected to each other through the second wiring layer.

BRIEF DESCRIPTION OF THE DRAWINGS

Features will become apparent to those of skill in the art by describing in detail exemplary embodiments with reference to the attached drawings, in which:

FIG. 3 is a cross-sectional view taken along line B-B' of FIG. 1.

FIGS. 4 to 15 are views of stages in a method of manufacturing a semiconductor device according to some embodiments of the present disclosure.

FIG. 21 is a plan view of a semiconductor device according to some embodiments of the present disclosure.

FIG. 23 is a cross-sectional view taken along line F-F' of FIG. 21.

DETAILED DESCRIPTION

Hereinafter, a semiconductor device according to some embodiments of the present disclosure will be described with reference to FIGS. 1 to 3.

Figure 1:
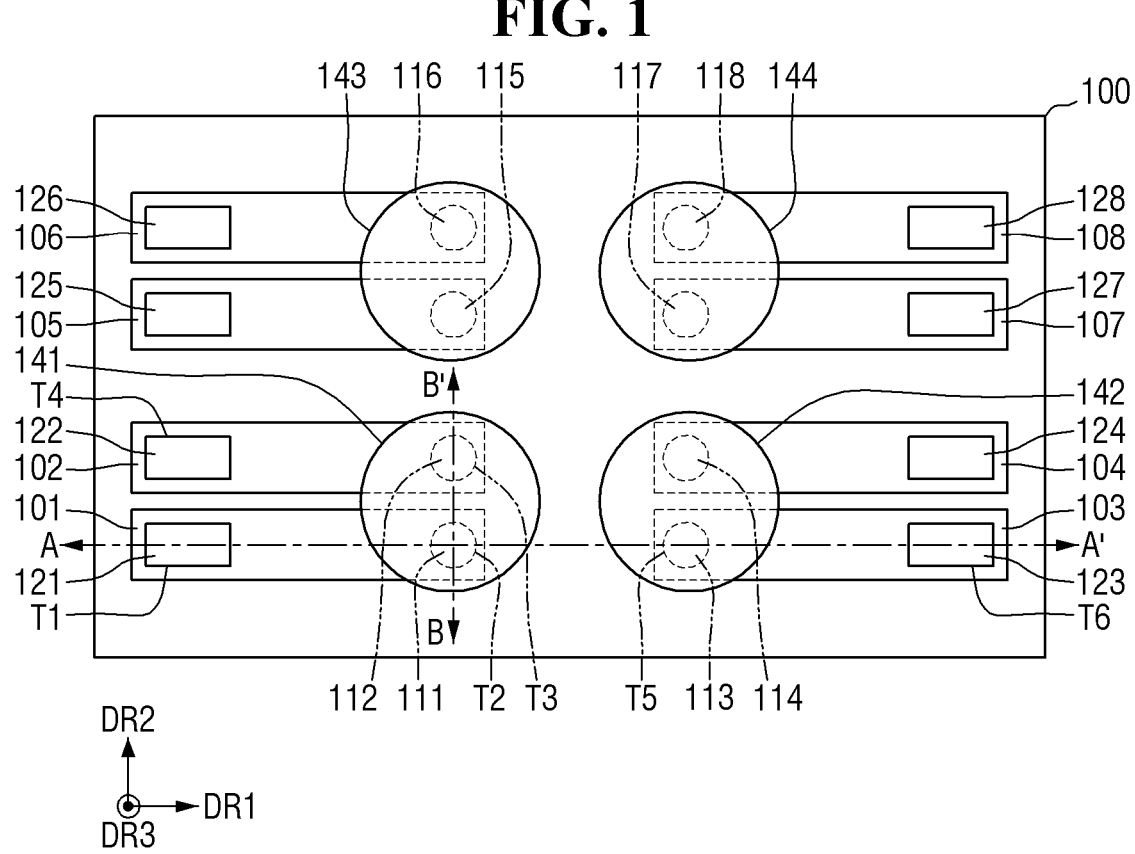
FIG. 1 is a plan view of a semiconductor device according to some embodiments of the present disclosure.

FIG. 1 is a plan view of a semiconductor device according to some embodiments of the present disclosure. FIG. 2 is a cross-sectional view taken along line A-A' of FIG. 1. FIG. 3 is a cross-sectional view taken along line B-B' of FIG. 1.

Figure 2:
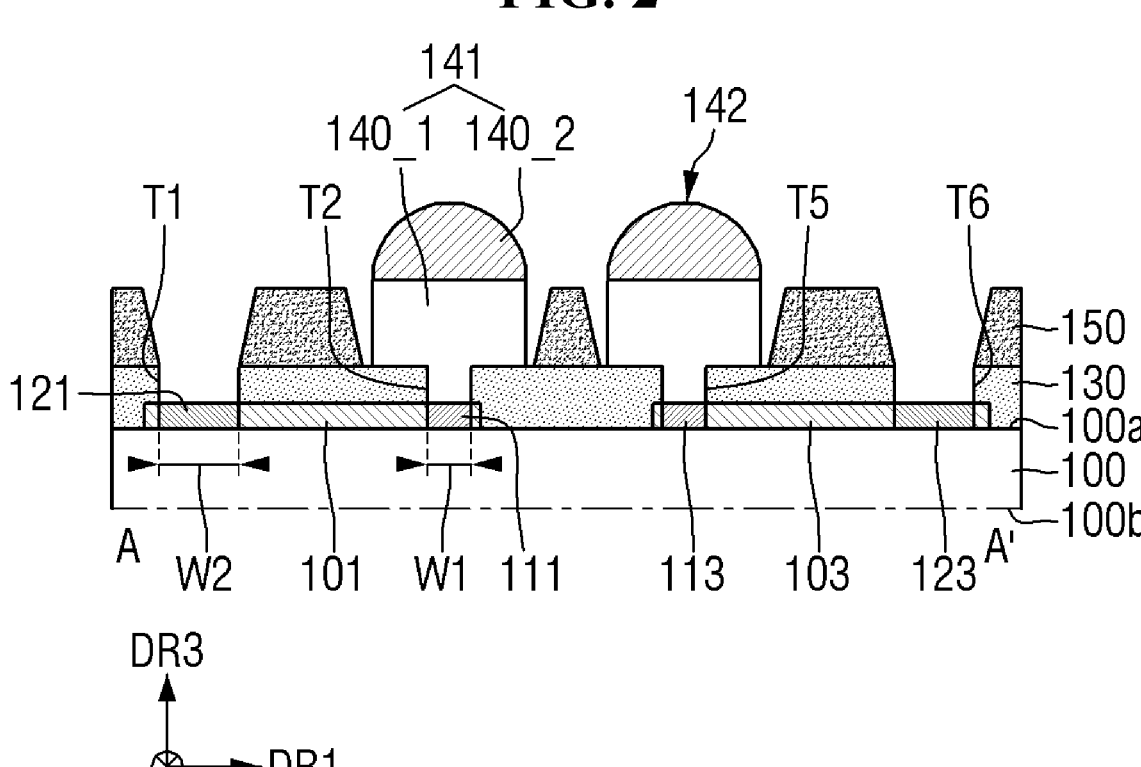
FIG. 2 is a cross-sectional view taken along line A-A' of FIG. 1.
Figure 2:
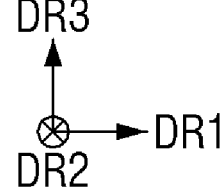
Figure 3:
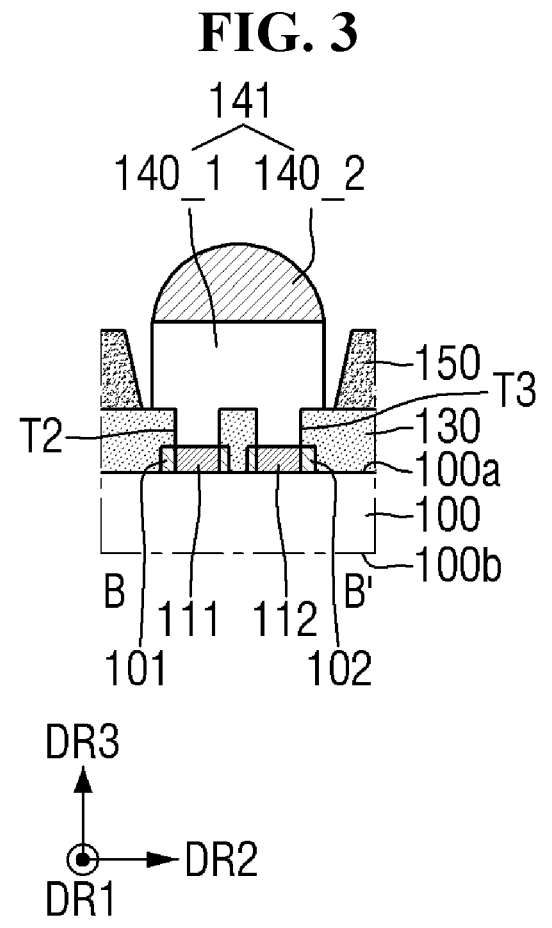

Referring to FIGS. 1 to 3, a semiconductor device according to some embodiments of the present disclosure may include a first substrate 100, first to eighth wiring layers 101 to 108, first to eighth bump pads 111 to 118, first to eighth test pads 121 to 128, a passivation layer 130, first to fourth bumps 141 to 144, and a photosensitive layer 150. As used herein, the terms "first," "second," and the like are merely for identification and differentiation, and are not intended to imply or require sequential inclusion (e.g., a third element and a fourth element may be described without implying or requiring the presence of a first element or second element).

The first substrate 100 may include a first surface 100a and a second surface 100b opposing the first surface 100a. The first substrate 100 may be a substrate formed on a chip basis in which a wafer is divided into a plurality of parts. In some embodiments, the first substrate 100 may be formed on a wafer basis. When the first substrate 100 is formed on a divided chip basis, the first substrate 100 may be, e.g., a memory chip, a logic chip, or the like.

When the first substrate 100 is a logic chip, the first substrate 100 may be designed diversely in consideration of a computation to be performed, etc. When the first substrate 100 is a memory chip, the memory chip may be, e.g., a non-volatile memory chip.

For example, the memory chip may be a flash memory chip, e.g., a NAND flash memory chip or a NOR flash memory chip. In some embodiments, the memory chip may include any one of a phase change random access memory (PRAM), a magneto-resistive random access memory (MRAM), or a resistive random access memory (RRAM). In addition, in some embodiments, when the first substrate 100 is a substrate formed on a wafer basis, the first substrate 100 may include a logic element or a memory element which performs the same function as described above.

Each of the first to eighth wiring layers 101 to 108 may be disposed on the first surface 100a of the first substrate 100. For example, each of the first to eighth wiring layers 101 to 108 may extend in a first horizontal direction DR1.

For example, each of the first to eighth wiring layers 101 to 108 may be in contact with the first surface 100a of the first substrate 100.

The second wiring layer 102 may be spaced apart from the first wiring layer 101 in a second horizontal direction DR2. Here, the second horizontal direction DR2 may be defined as a direction that is different from the first horizontal direction DR1. For example, the first horizontal direction DR1 and the second horizontal direction DR2 may be perpendicular to each other. The third wiring layer 103 may be spaced apart from the first wiring layer 101 in the first horizontal direction DR1. The fourth wiring layer 104 may be spaced apart from the third wiring layer 103 in the second horizontal direction DR2. Also, the fourth wiring layer 104 may be spaced apart from the second wiring layer 102 in the first horizontal direction DR1.

The fifth wiring layer 105 may be spaced apart from the second wiring layer 102 in the second horizontal direction DR2. The sixth wiring layer 106 may be spaced apart from the fifth wiring layer 105 in the second horizontal direction DR2. For example, a distance in the second horizontal direction DR2 between the fifth wiring layer 105 and the second wiring layer 102 may be greater than each of a distance in the second horizontal direction DR2 between the second wiring layer 102 and the first wiring layer 101 and a distance in the second direction DR2 between the sixth wiring layer 106 and the fifth wiring layer 105.

The seventh wiring layer 107 may be spaced apart from the fifth wiring layer 105 in the first horizontal direction DR1. Also, the seventh wiring layer 107 may be spaced apart from the fourth wiring layer 104 in the second horizontal direction DR2. The eighth wiring layer 108 may be spaced apart from the sixth wiring layer 106 in the first horizontal direction DR1. Also, the eighth wiring layer 108 may be spaced apart from the seventh wiring layer 107 in the second horizontal direction DR2. For example, a distance in the second horizontal direction DR2 between the seventh wiring layer 107 and the fourth wiring layer 104 may be greater than each of a distance in the second horizontal direction DR2 between the fourth wiring layer 104 and the third wiring layer 103 and a distance in the second direction DR2 between the eighth wiring layer 108 and the seventh wiring layer 107.

For example, each of the first wiring layer 101, the second wiring layer 102, the fifth wiring layer 105, and the sixth wiring layer 106 may be arranged, e.g., adjacent to each other, in the second horizontal direction DR2. Also, each of the third wiring layer 103, the fourth wiring layer 104, the seventh wiring layer 107, and the eighth wiring layer 108 may be arranged in the second horizontal direction DR2.

For example, the first wiring layer 101 and the third wiring layer 103 may be arranged, e.g., adjacent to each other, in the first horizontal direction DR1, the second wiring layer 102 and the fourth wiring layer 104 may be arranged in the first horizontal direction DR1, the fifth wiring layer 105 and the seventh wiring layer 107 may be arranged in the first horizontal direction DR1, and the sixth wiring layer 106 and the eighth wiring layer 108 may be arranged in the first horizontal direction DR1. Each of the first to eighth wiring layers 101 to 108 may include a conductive material.

The passivation layer 130 may be disposed on the first surface 100a of the first substrate 100. The passivation layer 130 may cover each of the first to eighth wiring layers 101 to 108. The passivation layer 130 may include, e.g., a nitride film or an oxide film. A plurality of trenches may be formed in the passivation layer 130 on each of the first to eighth wiring layers 101 to 108. The plurality of trenches may be spaced apart from each other.

For example, a first trench T1 and a second trench T2 may each be disposed inside the passivation layer 130 on the first wiring layer 101. The second trench T2 may be spaced apart from the first trench T1 in the first horizontal direction DR1. A third trench T3 and a fourth trench T4 may each be disposed in the passivation layer 130 on the second wiring layer 102. The third trench T3 may be spaced apart from the fourth trench T4 in the first horizontal direction DR1. The third trench T3 may be spaced apart from the second trench T2 in the second horizontal direction DR2. The fourth trench T4 may be spaced apart from the first trench T1 in the second horizontal direction DR2. A fifth trench T5 and a sixth trench T6 may each be disposed in the passivation layer 130 on the third wiring layer 103. The fifth trench T5 may be spaced apart from the second trench T2 in the first horizontal direction DR1. The sixth trench T6 may be spaced apart from the fifth trench T5 in the first horizontal direction DR1.

Portions of the respective first to eighth wiring layers 101 to 108 exposed by a part of the plurality of trenches may be defined as first to eighth bump pads 111 to 118, respectively. For example, a portion of the first wiring layer 101 exposed by the second trench T2 may be defined as the first bump pad 111. A portion of the second wiring layer 102 exposed by the third trench T3 may be defined as a second bump pad 112. A portion of the third wiring layer 103 exposed by the fifth trench T5 may be defined as a third bump pad 113.

Similarly, each of fourth to eighth bump pads 114 to 118 may be defined. For example, the fourth bump pad 114 may be defined in the fourth wiring layer 104, the fifth bump pad 115 may be defined in the fifth wiring layer 105, the sixth bump pad 116 may be defined in the sixth wiring layer 106, the seventh bump pad 117 may be defined in the seventh wiring layer 107, and the eighth bump pad 118 may be defined in the eighth wiring layer 108.

The second bump pad 112 may be spaced apart from the first bump pad 111 in the second horizontal direction DR2. The third bump pad 113 may be spaced apart from the first bump pad 111 in the first horizontal direction DR1. The fourth bump pad 114 may be spaced apart from the second bump pad 112 in the first horizontal direction DR1. Also, the fourth bump pad 114 may be spaced apart from the third bump pad 113 in the second horizontal direction DR2.

The fifth bump pad 115 may be spaced apart from the second bump pad 112 in the second horizontal direction DR2. The sixth bump pad 116 may be spaced apart from the fifth bump pad 115 in the second horizontal direction DR2. The seventh bump pad 117 may be spaced apart from the fifth bump pad 115 in the first horizontal direction DR1. Also, the seventh bump pad 117 may be spaced apart from the fourth bump pad 114 in the second horizontal direction DR2. The eighth bump pad 118 may be spaced apart from the sixth bump pad 116 in the first horizontal direction DR1. Also, the eighth bump pad 118 may be spaced apart from the seventh bump pad 117 in the second horizontal direction DR2.

For example, the first bump pad 111, the second bump pad 112, the fifth bump pad 115, and the sixth bump pad 116 may each be arranged, e.g., aligned and spaced apart from each other, in the second horizontal direction DR2. In addition, the third bump pad 113, the fourth bump pad 114, the seventh bump pad 117, and the eighth bump pad 118 may each be arranged, e.g., aligned and spaced apart from each other, in the second horizontal direction DR2.

For example, an upper surface of each of the first to eighth bump pads 111 to 118 may be formed at the same level as, e.g., on the same plane as, an upper surface of each of the first to eighth wiring layers 101 to 108, e.g., upper surfaces of all the first to eighth bump pads 111 to 118 and all the first to eighth wiring layers 101 to 108 may be coplanar with each other. A lower surface of each of the first to eighth bump pads 111 to 118 may be formed at the same level as, e.g., on the same plane as, a lower surface of each of the first to eighth wiring layers 101 to 108, e.g., lower surfaces of all the first to eighth bump pads 111 to 118 and all the first to eighth wiring layers 101 to 108 may be coplanar with each other. In other words, thicknesses of the first to eighth bump pads 111 to 118 and the first to eighth wiring layers 101 to 108 in a vertical direction DR3 may be equal to each other.

For example, as illustrated in FIG. 1, each of the first to eighth bump pads 111 to 118 may having a circular planar shape. Each of the first to eighth bump pads 111 to 118 may include a conductive material. For example, the first to eighth bump pads 111 to 118 may include the same material as the first to eighth wiring layers 101 to 108, respectively.

Other portions of the respective first to eighth wiring layers 101 to 108 exposed by the remaining part of the plurality of trenches may be defined as first to eighth test pads 121 to 128, respectively. For example, another portion of the first wiring layer 101 exposed by the first trench T1 may be defined as the first test pad 121. Another portion of the second wiring layer 102 exposed by the fourth trench T4 may be defined as a second test pad 122. Another portion of the third wiring layer 103 exposed by the sixth trench T6 may be defined as a third test pad 123.

Similarly, each of fourth to eighth test pads 124 to 128 may be defined. For example, the fourth test pad 124 may be defined in the fourth wiring layer 104, the fifth test pad 125 may be defined in the fifth wiring layer 105, the sixth test pad 126 may be defined in the sixth wiring layer 106, the seventh test pad 127 may be defined in the seventh wiring layer 107, and the eighth test pad 128 may be defined in the eighth wiring layer 108.

For example, the first test pad 121, the second test pad 122, the fifth test pad 125, and the sixth test pad 126 may be sequentially spaced apart from each other in the second horizontal direction DR2. For example, the first test pad 121, the second test pad 122, the fifth test pad 125, and the sixth test pad 126 may each be arranged in the second horizontal direction DR2. The first bump pad 111 may be spaced apart from the first test pad 121 in the first horizontal direction DR1, the second bump pad 112 may be spaced apart from the second test pad 122 in the first horizontal direction DR1, the fifth bump pad 115 may be spaced apart from the fifth test pad 125 in the first horizontal direction DR1, and the sixth bump pad 116 may be spaced apart from the sixth test pad 126 in the first horizontal direction DR1.

The third test pad 123, the fourth test pad 124, the seventh test pad 127, and the eighth test pad 128 may be sequentially spaced apart from each other in the second horizontal direction DR2. For example, the third test pad 123, the fourth test pad 124, the seventh test pad 127, and the eighth test pad 128 may each be arranged in the second horizontal direction DR2. The third test pad 123 may be spaced apart from the third bump pad 113 in the first horizontal direction DR1, the fourth test pad 124 may be spaced apart from the fourth bump pad 114 in the first horizontal direction DR1, the seventh test pad 127 may be spaced apart from the seventh bump pad 117 in the first horizontal direction DR1, and the eight test pad 128 may be spaced apart from the eighth bump pad 118 in the first horizontal direction DR1.

For example, an upper surface of each of the first to eighth test pads 121 to 128 may be formed at the same level as, e.g., on the same plane as, an upper surface of each of the first to eighth wiring layers 101 to 108. A lower surface of each of the first to eighth test pads 121 to 128 may be formed at the same level as, e.g., on the same plane as, a lower surface of each of the first to eighth wiring layers 101 to 108. Also, the upper surface of each of the first to eighth test pads 121 to 128 may be formed at the same level as, e.g., on the same plane as, the upper surface of each of the first to eighth bump pads 111 to 118. The lower surface of each of the first to eighth test pads 121 to 128 may be formed at the same level as, e.g., on the same plane as, a lower surface of each of the first to eighth bump pads 111 to 118.

For example, widths of the respective first to eighth test pads 121 to 128 in the first horizontal direction DR1 may be respectively greater than widths of the respective first to eighth bump pads 111 to 118 in the first horizontal direction DR1. For example, a width W2 of the first test pad 121 in the first horizontal direction DR1 may be greater than a width W1 of the first bump pad 111 in the first horizontal direction DR1.

For example, as illustrated in FIG. 1, each of the first to eighth test pads 121 to 128 may have a rectangular planar shape. Each of the first to eighth test pads 121 to 128 may include a conductive material. For example, the first to eighth test pads 121 to 128 may include the same material as the first to eighth wiring layers 101 to 108, respectively.

The first to eighth bump pads 111 to 118 may be directly electrically connected to the first to eighth test pads 121 to 128 through the first to eighth wiring layers 101 to 108, respectively. For example, as shown in FIG. 2, the first bump pad 111 and the first test pad 121 may be directly electrically connected to each other through the first wiring layer 101. In addition, the third bump pad 113 and the third test pad 123 may be directly electrically connected to each other through the third wiring layer 103.

The first bump 141 may be disposed on the first bump pad 111 and the second bump pad 112. The first bump 141 may overlap each of the first bump pad 111 and the second bump pad 112 in the vertical direction DR3. Here, the vertical direction DR3 may be defined as a direction that is perpendicular to each of the first horizontal direction DR1 and the second horizontal direction DR2.

At least a portion of the first bump 141 may be disposed in each of the second trench T2 and the third trench T3. The remaining portion of the first bump 141 may protrude from an upper surface of the passivation layer 130 in the vertical direction DR3. The first bump 141 may be directly connected to each of the first bump pad 111 and the second bump pad 112.

Each of the second to fourth bumps 142, 143, and 144 may have a similar structure to that of the first bump 141. For example, the second bump 142 may be disposed on the third bump pad 113 and the fourth bump pad 114. The second bump 142 may overlap each of the third bump pad 113 and the fourth bump pad 114 in the vertical direction DR3. The second bump 142 may be directly connected to each of the third bump pad 113 and the fourth bump pad 114. For example, the third bump 143 may be disposed on the fifth bump pad 115 and the sixth bump pad 116. The third bump 143 may overlap each of the fifth bump pad 115 and the sixth bump pad 116 in the vertical direction DR3. The third bump 143 may be directly connected to each of the fifth bump pad 115 and the sixth bump pad 116. For example, the fourth bump 144 may be disposed on the seventh bump pad 117 and the eighth bump pad 118. The fourth bump 144 may overlap each of the seventh bump pad 117 and the eighth bump pad 118 in the vertical direction DR3. The fourth bump 144 may be directly connected to each of the seventh bump pad 117 and the eighth bump pad 118.

The second bump 142 may be spaced apart from the first bump 141 in the first horizontal direction DR1. The third bump 143 may be spaced apart from the first bump 141 in the second horizontal direction DR2. The fourth bump 144 may be spaced apart from the third bump 143 in the first horizontal direction DR1. Also, the fourth bump 144 may be spaced apart from the second bump 142 in the second horizontal direction DR2.

Each of the first to fourth bumps 141, 142, 143, and 144 may include a lower bump 140_1 and an upper bump 140_2. The lower bumps 140_1 may be respectively connected to the first to eighth bump pads 111 to 118. At least a portion of each lower bump 140_1 may protrude from the upper surface of the passivation layer 130 in the vertical direction DR3. The lower bumps 140_1 may include at least one of, e.g., nickel (Ni), copper (Cu), palladium (Pd), platinum (Pt), gold (Au), or a combination thereof.

The upper bump 140_2 may be disposed on the lower bump 140_1. The upper bump 140_2 may be a portion that is connected to an external device. The upper bump 140_2 may include a conductive paste, e.g., a solder paste or a metal paste. The upper bump 140_2 may include, e.g., an alloy of tin and silver (SnAg) or tin (Sn).

Each of the first to fourth bumps 141, 142, 143, and 144 may be in contact with the upper surface of the passivation layer 130 adjacent to each of the first to eighth bump pads 111 to 118. The first bump 141 may be directly connected to each of the first bump pad 111 and the second bump pad 112 that are arranged in the second horizontal direction DR2. The second bump 142 may be directly connected to each of the third bump pad 113 and the fourth bump pad 114 that are arranged in the second horizontal direction DR2. The third bump 143 may be directly connected to each of the fifth bump pad 115 and the sixth bump pad 116 that are arranged in the second horizontal direction DR2. The fourth bump 144 may be directly connected to each of the seventh bump pad 117 and the eighth bump pad 118 that are arranged in the second horizontal direction DR2.

The photosensitive layer 150 may be disposed on the passivation layer 130. The photosensitive layer 150 may surround sidewalls of each of the first to fourth bumps 141, 142, 143, and 144. For example, the photosensitive layer 150 may be spaced apart from the sidewalls of each of the first to fourth bumps 141, 142, 143, and 144. In some embodiments, the photosensitive layer 150 may be in contact with the sidewalls of each of the first to fourth bumps 141, 142, 143, and 144. The photosensitive layer 150 may expose the upper surface of the passivation layer 130 adjacent to each of the first to eighth bump pads 111 to 118, e.g., the photosensitive layer 150 may expose a portion of the upper surface of the passivation layer 130 adjacent to (or surrounding) each of the first to fourth bumps 141, 142, 143, and 144. The photosensitive layer 150 may not expose the upper surface of the passivation layer 130 adjacent to each of the first to eighth test pads 121 to 128. The photosensitive layer 150 may expose a side surface of the passivation layer 130 adjacent to each of the first to eighth test pads 121 to 128.

The photosensitive layer 150 may not be disposed on each of the first to eighth test pads 121 to 128. That is, an upper portion of each of the first to eighth test pads 121 to 128 may be open. For example, the first to fourth bumps 141, 142, 143, and 144 may protrude farther than, e.g., above, the upper surface of the photosensitive layer 150 in the vertical direction DR3, e.g., relative to the bottom of the first substrate 100. For example, an upper surface of the lower bump 140_1 may protrude farther than, e.g., above, the upper surface of the photosensitive layer 150 in the vertical direction DR3. The photosensitive layer 150 may include, e.g., any one of a photosensitive polyimide (PSPI), a polyimide (PI), and a photosensitive polyhydroxystyrene.

Hereinafter, a method of manufacturing a semiconductor device according to some embodiments of the present disclosure will be described with reference to FIGS. 4 to 15. FIGS. 4 to 15 are views of stages in a method of manufacturing a semiconductor device according to some embodiments of the present disclosure. FIGS. 4, 6, 8, 10, 12, 14, and 15 correspond to the cross-section along line A-A' of FIG. 1, and FIGS. 5, 7, 9, 11, and 13 correspond to the cross-section along line B-B' of FIG. 1. Hereinafter, a description will be given focusing on configurations shown in the drawings.

Figure 4:
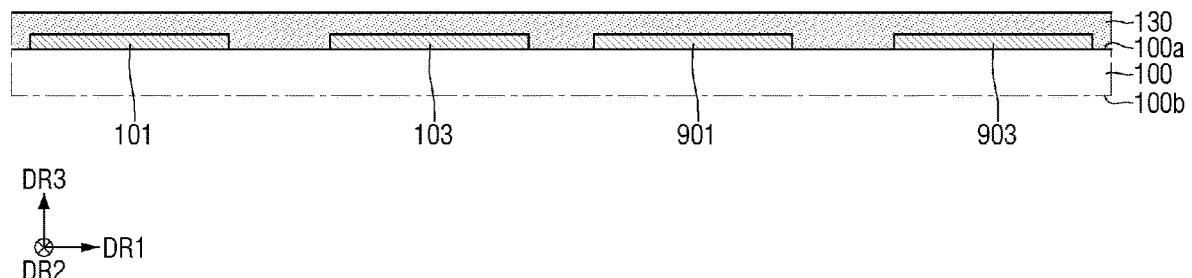
Figure 5:
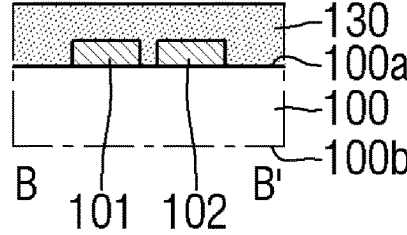
Figure 5:
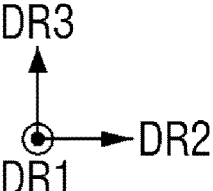

Referring to FIGS. 4 and 5, the first substrate 100 may be provided. The first substrate 100 may be, e.g., a wafer. Then, for example, the first wiring layer 101, the second wiring layer 102, the third wiring layer 103, a ninth wiring layer 901, and a tenth wiring layer 903 may be formed on the first surface 100a of the first substrate 100. The first wiring layer 101, the third wiring layer 103, the ninth wiring layer 901, and the tenth wiring layer 903 may be sequentially spaced apart from each other in the first horizontal direction DR1. The second wiring layer 102 may be spaced apart from the first wiring layer 101 in the second horizontal direction DR2.

Then, the passivation layer 130 may be formed on the first surface 100a of the first substrate 100 to cover each of the first wiring layer 101, the second wiring layer 102, the third wiring layer 103, the ninth wiring layer 901, and the tenth wiring layer 903.

Figures 6, 7:
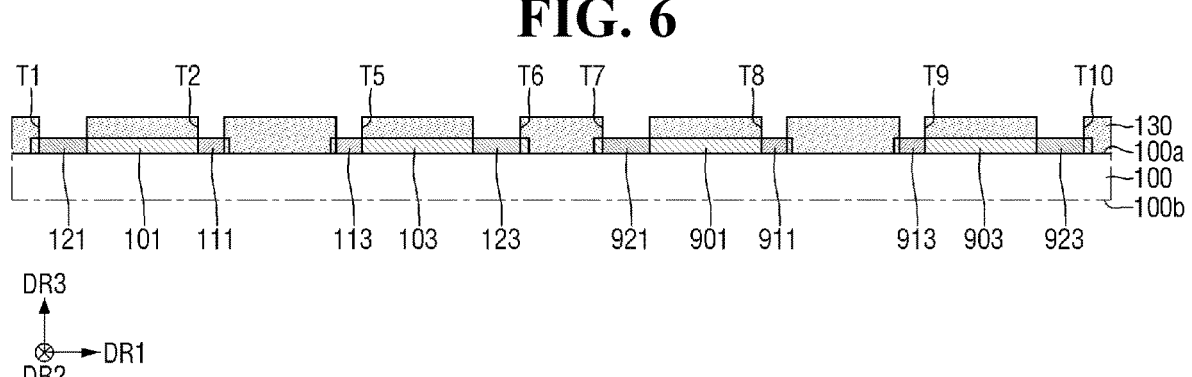

Referring to FIGS. 6 and 7, the first to third trenches T1, T2, and T3 and fifth to tenth trenches T5 to T10 may each be formed inside the passivation layer 130.

For example, the first trench T1 may be formed inside the passivation layer 130, on a portion of the first wiring layer 101. The portion of the first wiring layer 101 exposed by the first trench T1 may be defined as the first test pad 121. The second trench T2 may be formed inside the passivation layer 130, on another portion of the first wiring layer 101. The other portion of the first wiring layer 101 exposed by the second trench T2 may be defined as the first bump pad 111. The third trench T3 may be formed inside the passivation layer 130, on a portion of the second wiring layer 102. The portion of the second wiring layer 102 exposed by the third trench T3 may be defined as the second bump pad 112. The fifth trench T5 may be formed inside the passivation layer 130, on a portion of the third wiring layer 103. The portion of the third wiring layer 103 exposed by the fifth trench T5 may be defined as the third bump pad 113. The sixth trench T6 may be formed inside the passivation layer 130, on another portion of the third wiring layer 103. The other portion of the third wiring layer 103 exposed by the sixth trench T6 may be defined as the third test pad 123.

In addition, the seventh trench T7 may be formed inside the passivation layer 130, on a portion of the ninth wiring layer 901. The portion of the ninth wiring layer 901 exposed by the seventh trench T7 may be defined as a ninth test pad 921. The eighth trench T8 may be formed inside the passivation layer 130, on another portion of the ninth wiring layer 901. The other portion of the ninth wiring layer 901 exposed by the eighth trench T8 may be defined as a ninth bump pad 911. The ninth trench T9 may be formed inside the passivation layer 130, on a portion of the tenth wiring layer 903. The portion of the tenth wiring layer 903 exposed by the ninth trench T9 may be defined as a tenth bump pad 913. The tenth trench T10 may be formed inside the passivation layer 130, on another portion of the tenth wiring layer 903. The other portion of the tenth wiring layer 903 exposed by the tenth trench T10 may be defined as a tenth test pad 923.

Figures 8, 9:
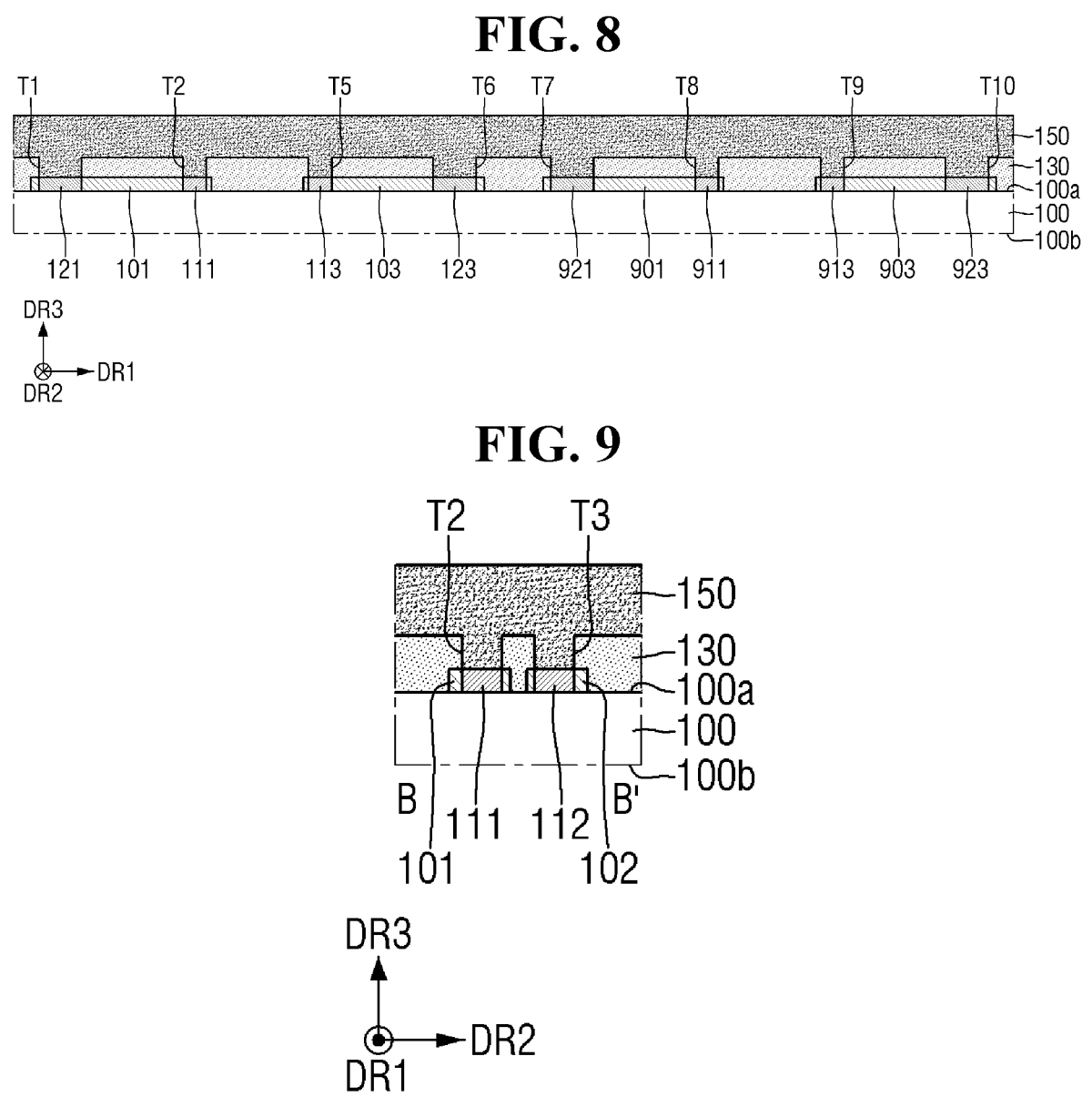

Referring to FIGS. 8 and 9, the photosensitive layer 150 may be formed on the passivation layer 130. The photosensitive layer 150 may fill the first to third trenches T1, T2, and T3 and the fifth to tenth trenches T5 to T10.

Figure 10:
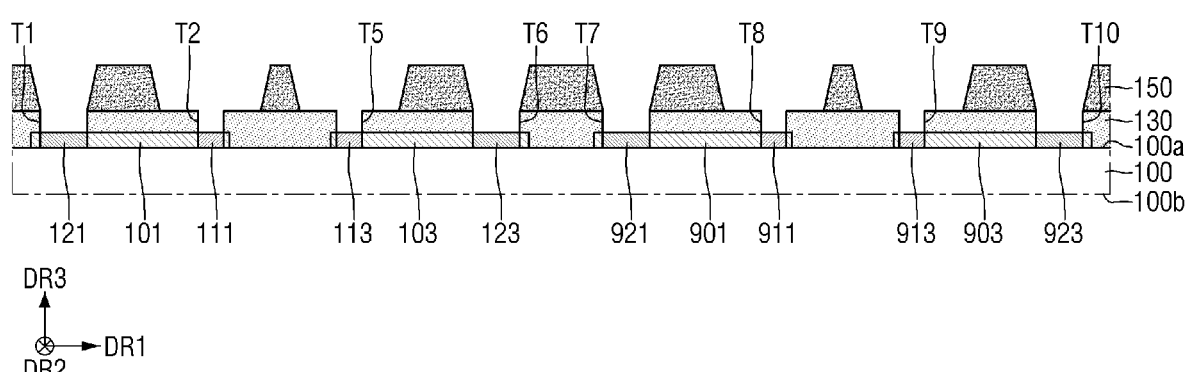
Figure 11:
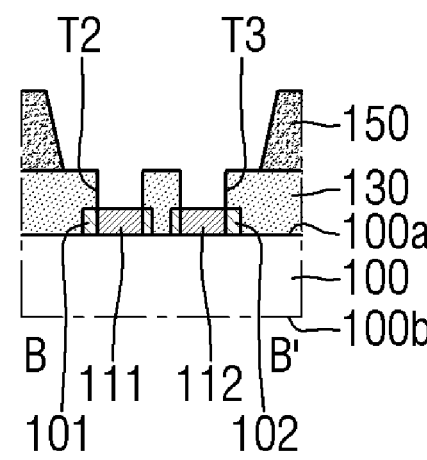
Figure 11:
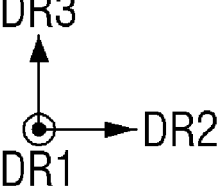

Referring to FIGS. 10 and 11, the photosensitive layer 150 may be etched to expose the first to third bump pads 111, 112, and 113, the ninth bump pad 911, the tenth bump pad 913, the first test pad 121, the third test pad 123, the ninth test pad 921, and the tenth test pad 923. In this case, an upper surface and a side surface of the passivation layer 130 adjacent to each of the first to third bump pads 111, 112, and 113, the ninth bump pad 911, and the tenth bump pad 913 may be exposed. The upper surface of the passivation layer 130 adjacent to each of the first test pad 121, the third test pad 123, the ninth test pad 921, and the tenth test pad 923 may not be exposed. The side surface of the passivation layer 130 adjacent to each of the first test pad 121, the third test pad 123, the ninth test pad 921, and the tenth test pad 923 may be exposed.

Figure 12:
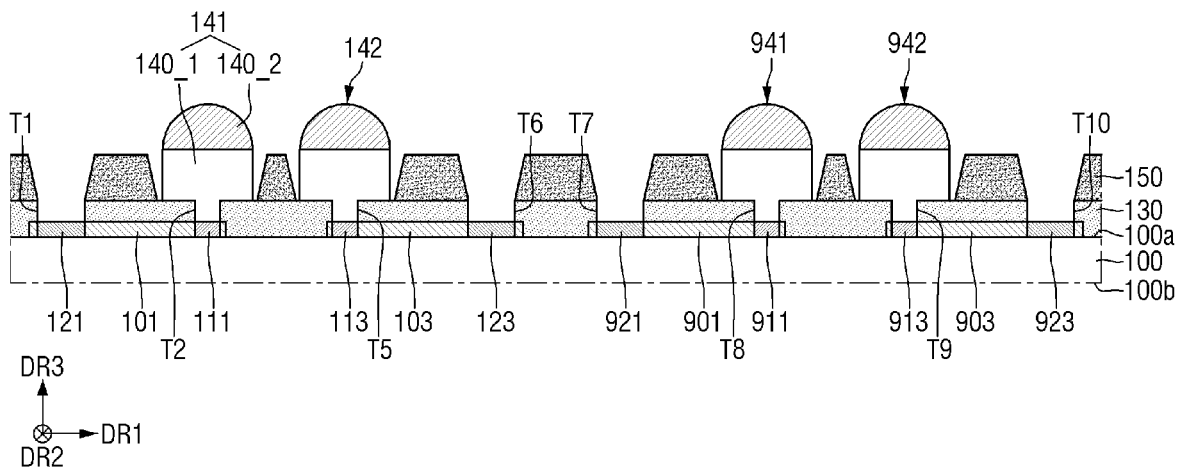
Figure 13:
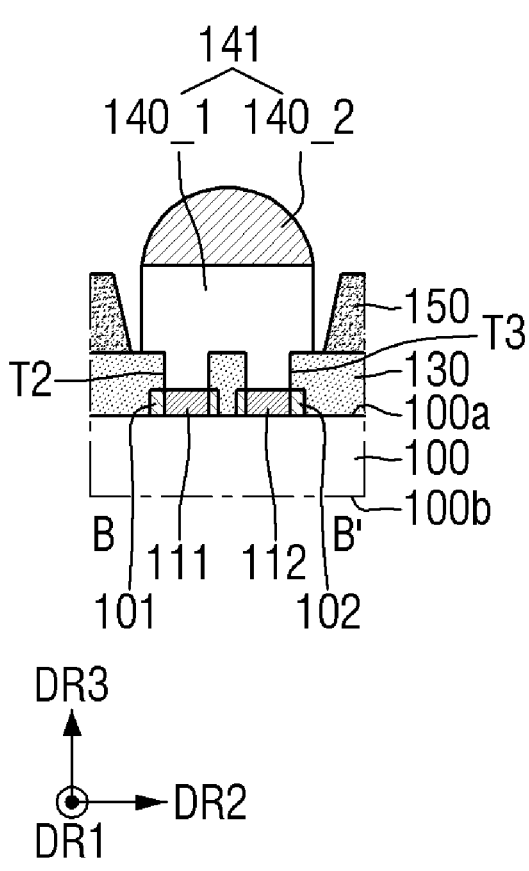

Referring to FIGS. 12 and 13, the first bump 141 may be formed on the first bump pad 111 and the second bump pad 112. In addition, the second bump 142 may be formed on the third bump pad 113, the fifth bump 941 may be formed on the ninth bump pad 911, and the sixth bump 942 may be formed on the tenth bump pad 913. For example, the first bump 141 on the passivation layer 130 adjacent to each of the first bump pad 111 and the second bump pad 112 may be in contact with the upper surface and side surface of the passivation layer 130 exposed by the photosensitive layer 150. The second bump 142 on the passivation layer 130 adjacent to the third bump pad 113 may be in contact with the upper surface and side surface of the passivation layer exposed by the photosensitive layer 150. The fifth bump 941 on the passivation layer 130 adjacent to the ninth bump pad 911 may be in contact with the upper surface and side surface of the passivation layer 130 exposed by the photosensitive layer 150. The sixth bump 942 on the passivation layer 130 adjacent to the tenth bump pad 913 may be in contact with the upper surface and side surface of the passivation layer 130 exposed by the photosensitive layer 150.

Figure 14:
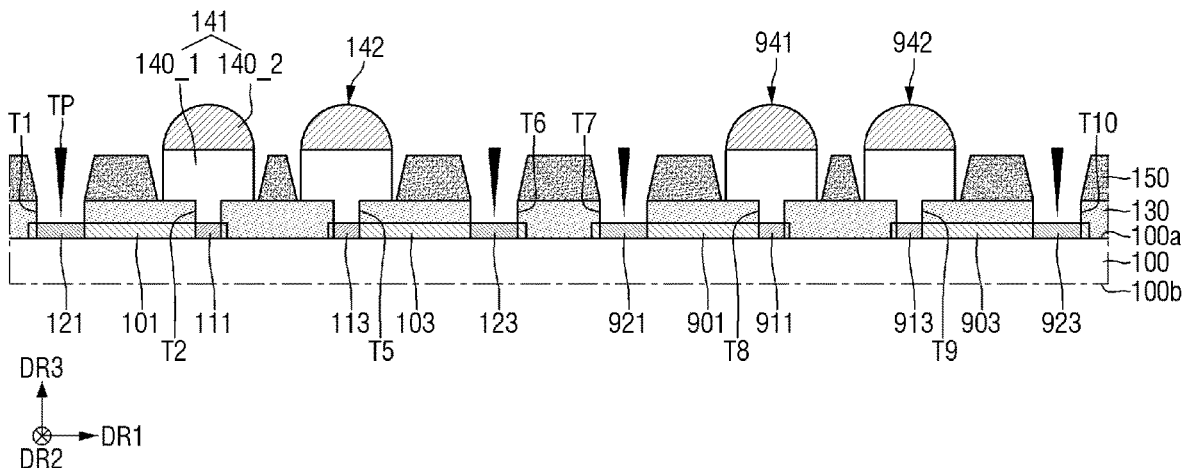

Referring to FIG. 14, a test process for the first test pad 121, the third test pad 123, the ninth test pad 921, and the tenth test pad 923 may be performed respectively through the first trench T1, the sixth trench T6, the seventh trench T7, and the tenth trench T10.

The test process may be performed to test the electrical connection and interface resistance between each of the first to third bump pads 111, 112, and 113, the ninth bump pad 911, and the tenth bump pad 913, and each of the first bump 141, the second bump 142, the fifth bump 941, and the sixth bump 942. For example, test equipment including a probe TP may be provided. The test equipment may perform a test process by bringing the probe in physical contact with each of the first test pad 121, the third test pad 123, the ninth test pad 921, and the tenth test pad 923. Such a contact test process may show relatively higher performance than a non-contact test process.

Figure 15:
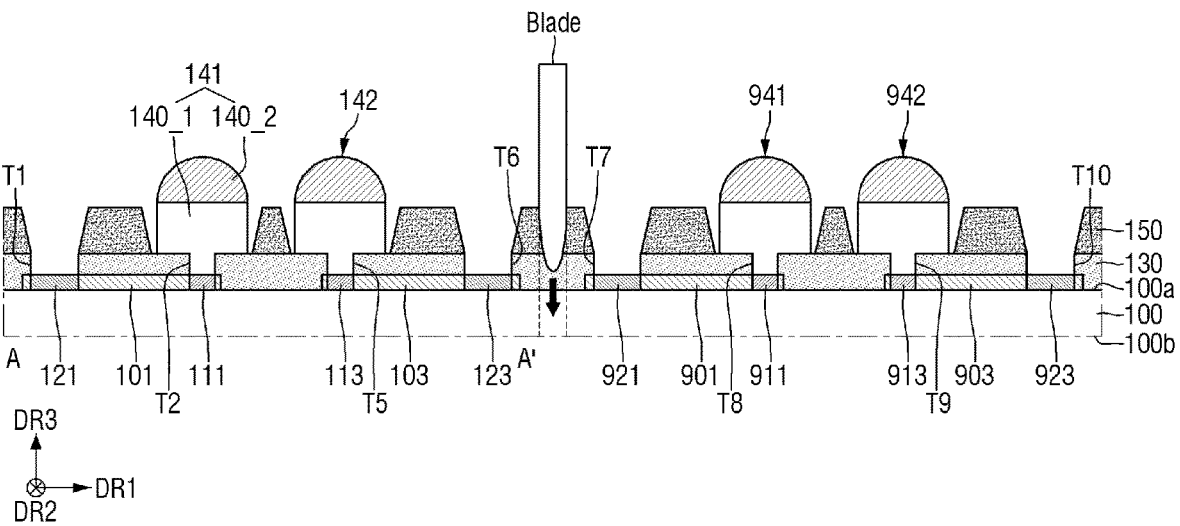

Referring to FIG. 15, a sawing process may be performed. For example, the sawing process may be performed using a blade. For example, the blade may cut the first substrate 100, the passivation layer 130, and the photosensitive layer 150 between the third wiring layer 103 and the ninth wiring layer 901. Through this process, the semiconductor device shown in FIGS. 1 to 3 may be fabricated.

The semiconductor device according to some embodiments of the present disclosure may effectively test the interface resistance and electrical connection between the bump and bump pad by connecting one bump to two bump pads spaced apart from each other and electrically connecting the bump pad and the test pad. In addition, the semiconductor device according to some embodiments of the present disclosure may effectively test the interface resistance and electrical connection between the bump and the bump pad by performing a test process at a wafer level before a sawing process is performed during the manufacture process.

Hereinafter, a semiconductor device according to some embodiments of the present disclosure will be described with reference to FIGS. 16 and 17. A description will be given focusing on differences relative to the semiconductor device shown in FIGS. 1 to 3.

Figure 16:
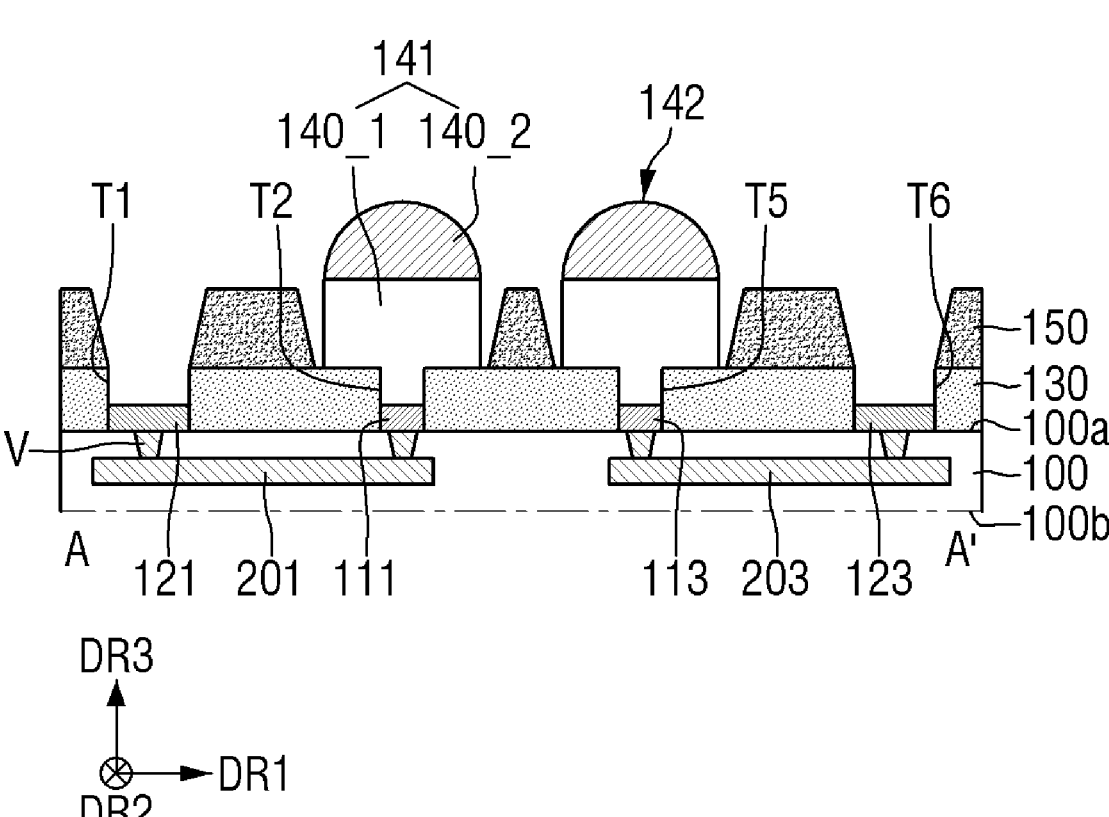
FIGS. 16 and 17 are views of stages in a method of manufacturing a semiconductor device according to some embodiments of the present disclosure.
Figure 17:
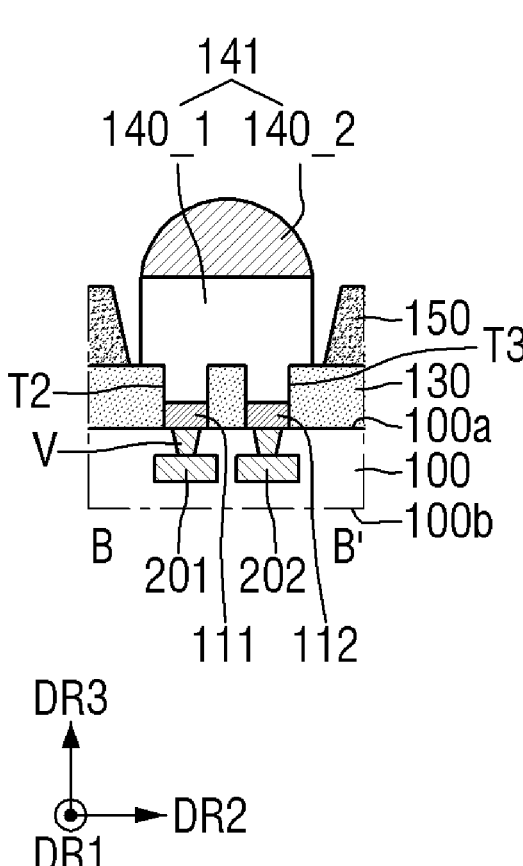

FIGS. 16 and 17 are views of stages in a method of a semiconductor device according to some embodiments of the present disclosure.

Referring to FIGS. 16 and 17, the semiconductor device according to some embodiments of the present disclosure may have first to eighth wiring layers disposed inside the first substrate 100.

For example, first to third wiring layers 201, 202, and 203 may each be disposed inside the first substrate 100. The first wiring layer 201 may be connected to each of the first bump pad 111 and the first test pad 121 through vias V. The second wiring layer 202 may be connected to each of the second bump pad 112 and the second test pad 122 (see FIG. 1) through vias V. The third wiring layer 203 may be connected to each of the third bump pad 113 and the third test pad 123 through vias V.

The first wiring layer 201 may overlap each of the first bump pad 111 and the first test pad 121 in the vertical direction DR3. The second wiring layer 202 may overlap each of the second bump pad 112 and the second test pad 122 (see FIG. 1) in the vertical direction DR3. The third wiring layer 203 may overlap each of the third bump pad 113 and the third test pad 123 in the vertical direction DR3.

A semiconductor device according to some embodiments of the present disclosure will be described hereinafter with reference to FIGS. 18 to 20. A description will be given focusing on differences relative to the semiconductor device shown in FIGS. 1 to 3.

Figure 18:
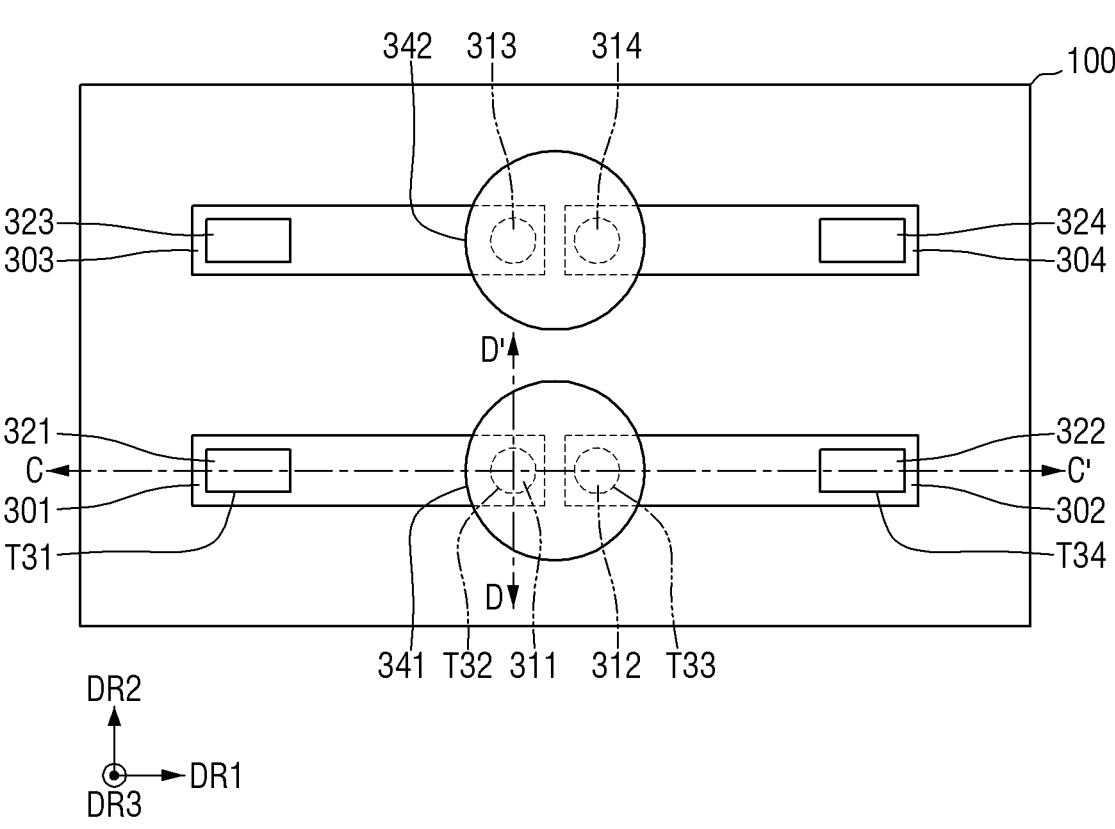
FIG. 18 is a plan view of a semiconductor device according to some embodiments of the present disclosure.

FIG. 18 is a plan view of a semiconductor device according to some embodiments of the present disclosure. FIG. 19 is a cross-sectional view taken along line C-C' of FIG. 18. FIG. 20 is a cross-sectional view taken along line D-D' of FIG. 18.

Figure 19:
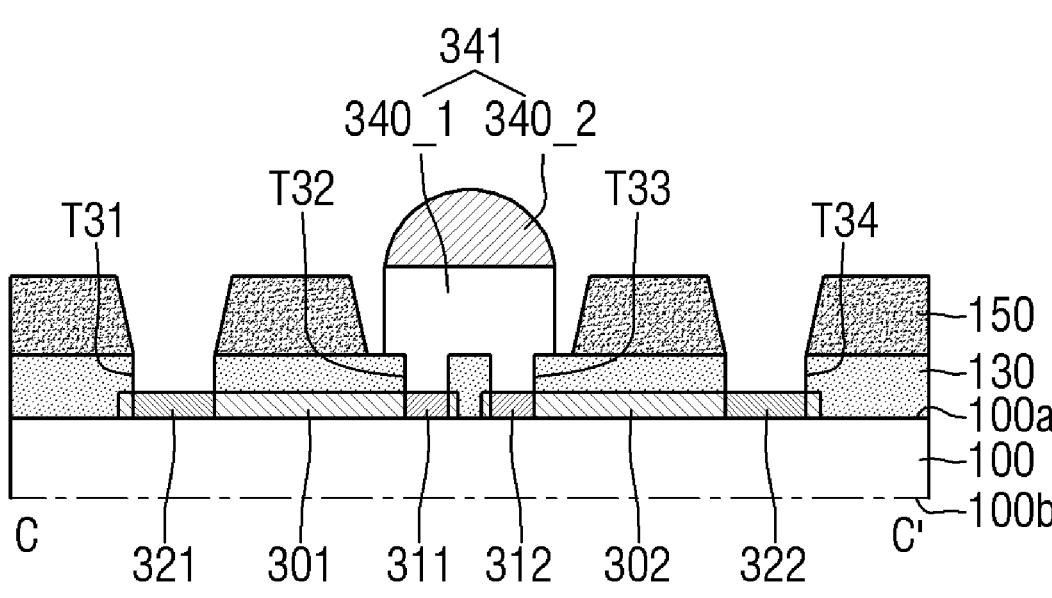
FIG. 19 is a cross-sectional view taken along line C-C' of FIG. 18.
Figure 19:
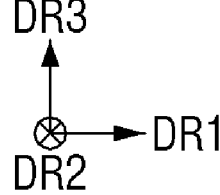
Figure 20:
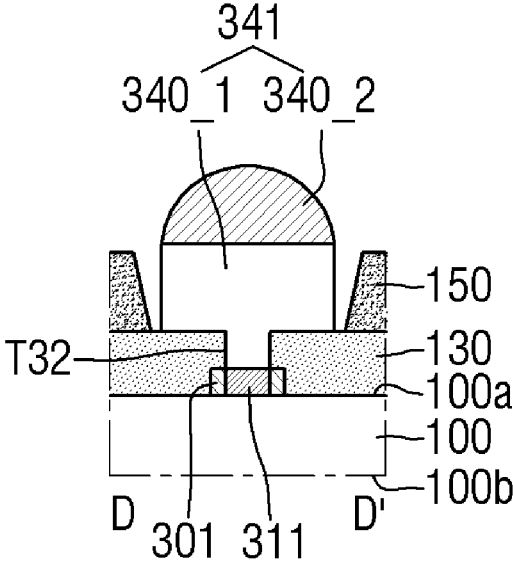
FIG. 20 is a cross-sectional view taken along line D-D' of FIG. 18.
Figure 20:
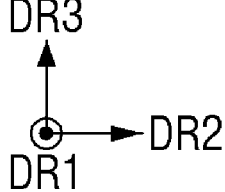

Referring to FIGS. 18 to 20, a semiconductor device according to some embodiments of the present disclosure may include the first substrate 100, first to fourth wiring layers 301 to 304, first to fourth bump pads 311 to 314, first to fourth test pads 321 to 324, the passivation layer 130, a first bump 341, a second bump 342, and the photosensitive layer 150.

Each of the first to fourth wiring layers 301 to 304 may be disposed on the first surface 100a of the first substrate 100. For example, each of the first to fourth wiring layers 301 to 304 may extend in the first horizontal direction DR1. The second wiring layer 302 may be spaced apart from the first wiring layer 301 in the first horizontal direction DR1. The third wiring layer 303 may be spaced apart from the first wiring layer 301 in the second horizontal direction DR2. The fourth wiring layer 304 may be spaced apart from the third wiring layer 303 in the first horizontal direction DR1. Also, the fourth wiring layer 304 may be spaced apart from the second wiring layer 302 in the second horizontal direction DR2.

A plurality of trenches may be formed in the passivation layer 130 on each of the first to fourth wiring layers 301 to 304. The plurality of trenches may be spaced apart from each other. For example, a first trench T31 and a second trench T32 may each be disposed inside the passivation layer 130 on the first wiring layer 301. The second trench T32 may be spaced apart from the first trench T31 in the first horizontal direction DR1. A third trench T33 and a fourth trench T34 may each be disposed in the passivation layer 130 on the second wiring layer 302. The third trench T33 may be spaced apart from the second trench T32 in the first horizontal direction DR1. The fourth trench T34 may be spaced apart from the third trench T33 in the first horizontal direction DR1.

Portions of the respective first to fourth wiring layers 301 to 304 exposed by a part of the plurality of trenches may be defined as the first to fourth bump pads 311 to 314, respectively. For example, a portion of the first wiring layer 301 exposed by the second trench T32 may be defined as the first bump pad 311. A portion of the second wiring layer 302 exposed by the third trench T33 may be defined as the second bump pad 312. Similarly, each of the third bump pad 313 and the fourth bump pad 314 may be defined. For example, the third bump pad 313 may be defined on the third wiring layer 303, and the fourth bump pad 314 may be defined on the fourth wiring layer 304.

The second bump pad 312 may be spaced apart from the first bump pad 311 in the first horizontal direction DR1. The third bump pad 313 may be spaced apart from the first bump pad 311 in the second horizontal direction DR2. The fourth bump pad 314 may be spaced apart from the third bump pad 313 in the first horizontal direction DR1. Also, the fourth bump pad 314 may be spaced apart from the second bump pad 312 in the second horizontal direction DR2.

Other portions of the respective first to fourth wiring layers 301 to 304 exposed by the remaining part of the plurality of trenches may be defined as the first to fourth test pads 321 to 324, respectively. For example, another portion of the first wiring layer 301 exposed by the first trench T31 may be defined as the first test pad 321. Another portion of the second wiring layer 302 exposed by the fourth trench T34 may be defined as a second test pad 322. Similarly, each of the third test pad 323 and the fourth test pad 324 may be defined. For example, the third test pad 323 may be defined on the third wiring layer 303, and the fourth test pad 324 may be defined on the fourth wiring layer 304.

The first bump pad 311 may be spaced apart from the first test pad 321 in the first horizontal direction DR1. The second test pad 322 may be spaced apart from the second bump pad 312 in the first horizontal direction DR1. The third test pad 323 may be spaced apart from the first test pad 321 in the second horizontal direction DR2. The fourth test pad 324 may be spaced apart from the fourth bump pad 314 in the first horizontal direction DR1.

The first to fourth bump pads 311 to 314 may be directly electrically connected to the first to fourth test pads 321 to 324 through the first to fourth wiring layers 301 to 304, respectively. For example, as shown in FIG. 19, the first bump pad 311 and the first test pad 321 may be directly electrically connected to each other through the first wiring layer 301. In addition, the third bump pad 313 and the third test pad 323 may be directly electrically connected to each other through the third wiring layer 303.

The first bump 341 may be disposed on the first bump pad 311 and the second bump pad 312. The first bump 341 may overlap each of the first bump pad 311 and the second bump pad 312 in the vertical direction DR3. At least a portion of the first bump 341 may be disposed in each of the second trench T32 and the third trench T33. The first bump 341 may be directly connected to each of the first bump pad 311 and the second bump pad 312.

The second bump 342 may have a similar structure to that of the first bump 341. For example, the second bump 342 may be disposed on the third bump pad 313 and the fourth bump pad 314. The second bump 342 may overlap each of the third bump pad 313 and the fourth bump pad 314 in the vertical direction DR3.

The second bump 342 may be spaced apart from the first bump 341 in the second horizontal direction DR2. Each of the first and second bumps 341 and 342 may include a lower bump 340_1 and an upper bump 340_2. The lower bump 340_1 may be respectively connected to the first to fourth bump pads 311 to 314. The upper bump 340_2 may be disposed on the lower bump 340_1.

For example, the first wiring layer 301 and the second wiring layer 302 may be arranged in the first horizontal direction DR1, and the third wiring layer 303 and the fourth wiring layer 304 may be arranged in the first horizontal direction DR1. For example, the first bump pad 311 and the second bump pad 312 may be arranged in the first horizontal direction DR1. The first bump 341 may be directly connected to each of the first bump pad 311 and the second bump pad 312 that are arranged in the first horizontal direction DR1. For example, the third bump pad 313 and the fourth bump pad 314 may be arranged in the first horizontal direction DR1. The second bump 342 may be directly connected to each of the third bump pad 313 and the fourth bump pad 314 that are arranged in the first horizontal direction DR1.

A semiconductor device according to some embodiments of the present disclosure will be described hereinafter with reference to FIGS. 21 to 23. A description will be given focusing on differences relative to the semiconductor device shown in FIGS. 1 to 3.

Figure 21:
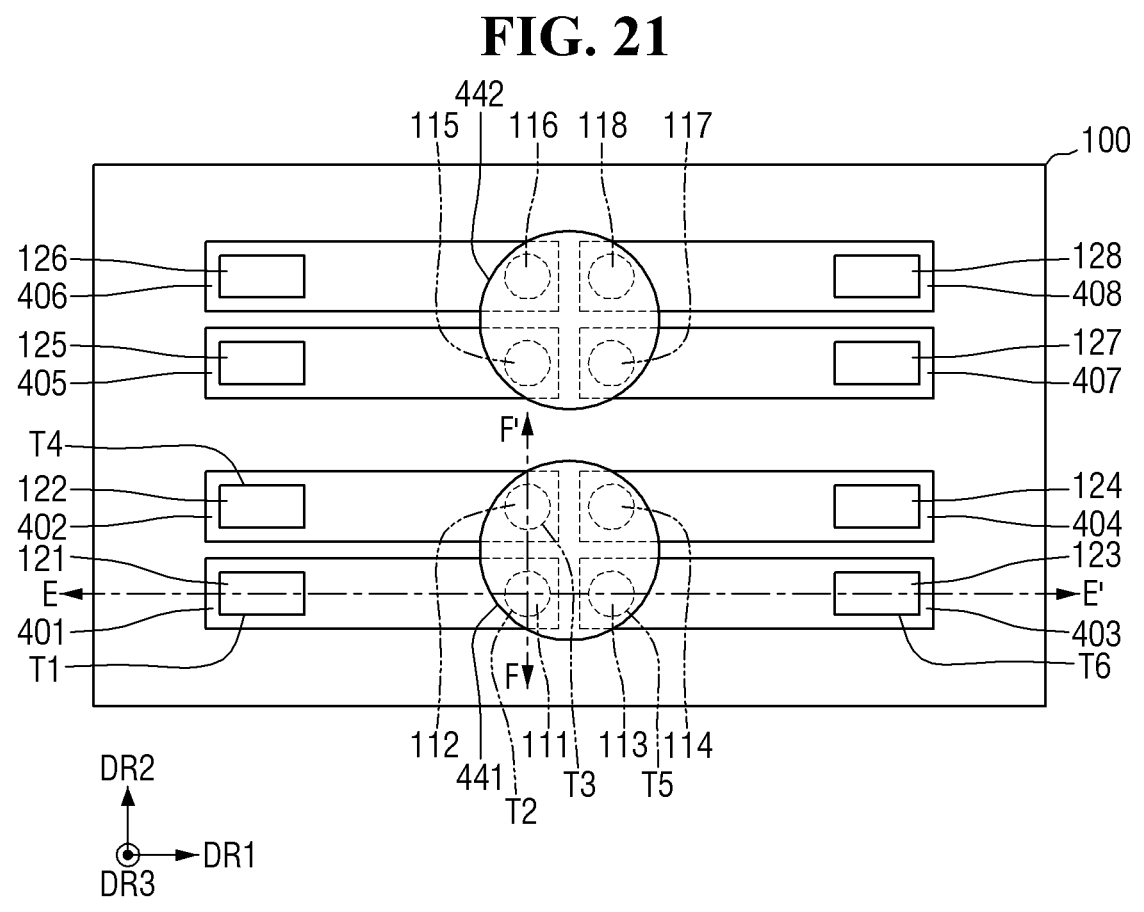

FIG. 21 is a plan view of a semiconductor device according to some embodiments of the present disclosure. FIG. 22 is a cross-sectional view taken along line E-E' of FIG. 21. FIG. 23 is a cross-sectional view taken along line F-F' of FIG. 21.

Figure 22:
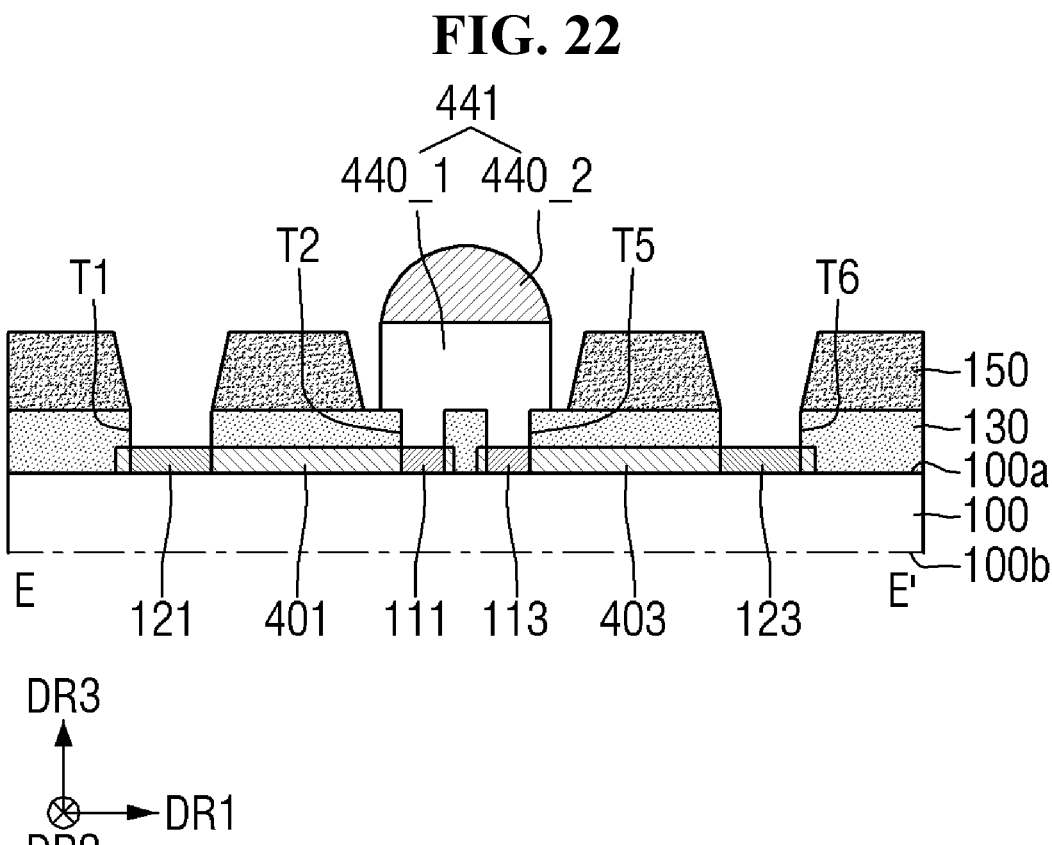
FIG. 22 is a cross-sectional view taken along line E-E' of FIG. 21.
Figure 23:
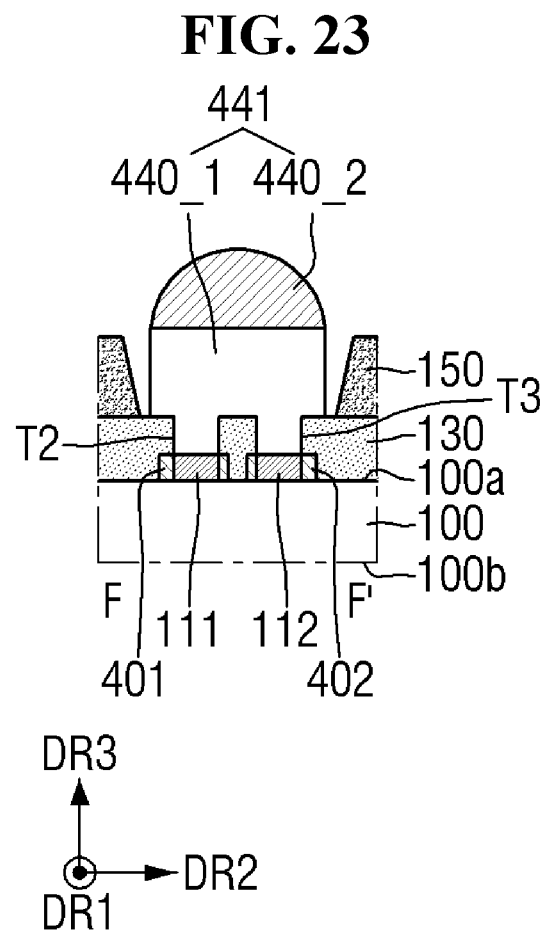

Referring to FIGS. 21 to 23, a semiconductor device according to some embodiments of the present disclosure may include a first bump 441 directly connected to each of the first to fourth bump pads 111, 112, 113, and 114, and a second bump 442 directly connected to each of the fifth to eighth bump pads 115, 116, 117, and 118.

For example, the first bump 441 may be disposed on the first to fourth bump pads 111, 112, 113, and 114. The first bump 441 may overlap each of the first to fourth bump pads 111, 112, 113, and 114 in the vertical direction DR3. The second bump 442 may be disposed on the fifth to eighth bump pads 115, 116, 117, and 118. The second bump 442 may overlap each of the fifth to eighth bump pads 115, 116, 117, and 118 in the vertical direction DR3.

The second bump 442 may be spaced apart from the first bump 441 in the second horizontal direction DR2. Each of the first and second bumps 441 and 442 may include a lower bump 440_1 and an upper bump 440_2. The lower bump 440_1 may be respectively connected to the first to eighth bump pads 111 to 118. The upper bump 440_2 may be disposed on the lower bump 440_1.

The first to eighth wiring layers 401, 402, 403, 404, 405, 406, 407, and 408 may correspond to the first to eighth wiring layers 101, 102, 103, 104, 105, 106, 107, and 108, respectively. However, a distance in the first horizontal direction DR1 between the first wiring layer 401 and the third wiring layer 403, a distance in the first horizontal direction DR1 between the second wiring layer 402 and the fourth wiring layer 404, a distance in the first horizontal direction DR1 between the fifth wiring layer 405 and the seventh wiring layer 407, and a distance in the first horizontal direction DR1 between the sixth wiring layer 406 and the eighth wiring layer 408 may each be narrower than the first to eighth wiring layers 101, 102, 103, 104, 105, 106, 107, and 108.

For example, the first wiring layer 401 and the second wiring layer 402 may be arranged in the second horizontal direction DR2, the third wiring layer 403 and the fourth wiring layer 404 may be arranged in the second horizontal direction DR2, the fifth wiring layer 405 and the sixth wiring layer 406 may be arranged in the second horizontal direction DR2, and the seventh wiring layer 407 and the eighth wiring layer 408 may be arranged in the second horizontal direction DR2.

For example, the first wiring layer 401 and the third wiring layer 403 may be arranged in the first horizontal direction DR1, the second wiring layer 402 and the fourth wiring layer 404 may be arranged in the first horizontal direction DR1, the fifth wiring layer 405 and the seventh wiring layer 407 may be arranged in the first horizontal direction DR1, and the sixth wiring layer 406 and the eighth wiring layer 408 may be arranged in the first horizontal direction DR1.

For example, the first bump pad 111 and the second bump pad 112 may be aligned in the second horizontal direction DR2, and the third bump pad 113 and the fourth bump pad 114 may be aligned in the second horizontal direction DR2. The fifth bump pad 115 and the sixth bump pad 116 may be aligned in the second horizontal direction DR2, and the seventh bump pad 117 and the eighth bump pad 118 may be aligned in the second horizontal direction DR2.

For example, the first bump pad 111 and the third bump pad 113 may be aligned in the first horizontal direction DR1, and the second bump pad 112 and the fourth bump pad 114 may be aligned in the first horizontal direction DR1. The fifth bump pad 115 and the seventh bump pad 117 may be aligned in the first horizontal direction DR1, and the sixth bump pad 116 and the eighth bump pad 118 may be aligned in the first horizontal direction DR1.

The first bump 441 may be directly connected to each of the first to fourth bump pads 111, 112, 113, and 114 that are aligned with each other in the first horizontal direction DR1 and the second horizontal direction DR2. The second bump 442 may be directly connected to each of the fifth to eighth bump pads 115, 116, 117, and 118 that are aligned with each other in the first horizontal direction DR1 and the second horizontal direction DR2.

A semiconductor device according to some embodiments of the present disclosure will be described hereinafter with reference to FIG. 24. A description will be given focusing on differences relative to the semiconductor device shown in FIGS. 1 to 3.

Figure 24:
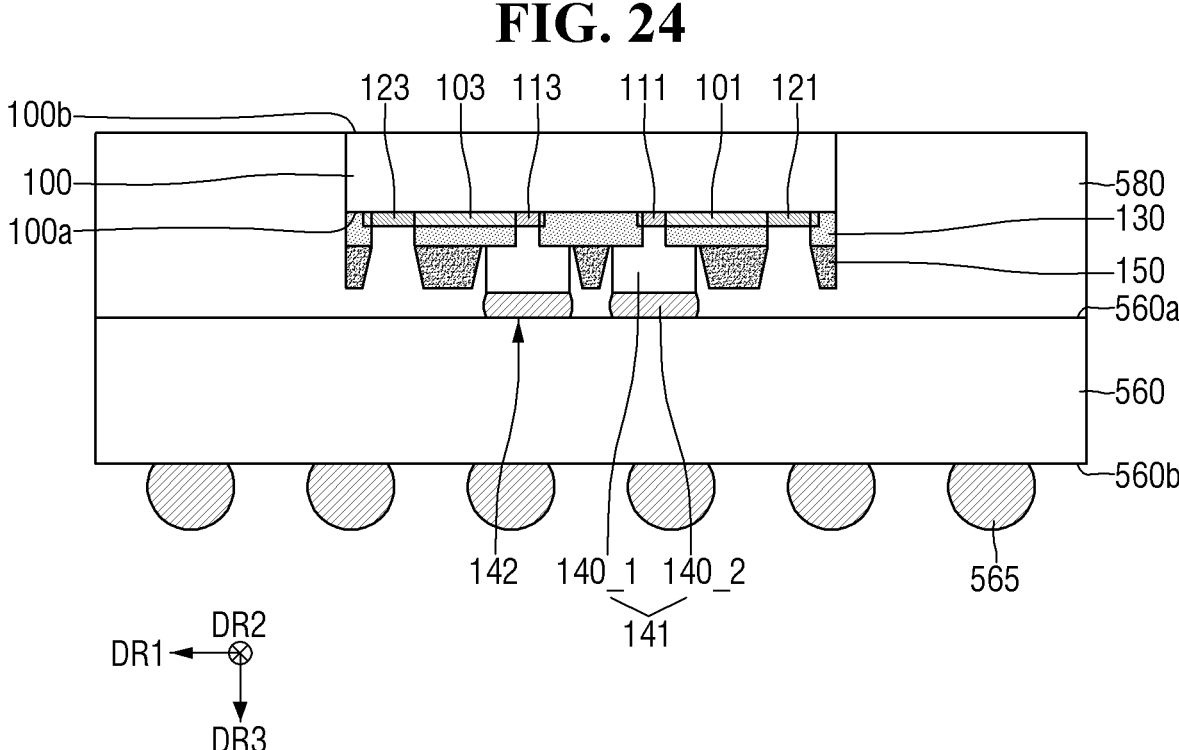
FIG. 24 is a cross-sectional view of a semiconductor device according to some embodiments of the present disclosure.

FIG. 24 is a cross-sectional view of a semiconductor device according to some embodiments of the present disclosure.

Referring to FIG. 24, in a semiconductor device according to some embodiments of the present disclosure, the semiconductor device shown in FIGS. 1 to 3 may be turned over and then disposed on a first surface 560a of a second substrate 560. That is, the first surface 100a of the first substrate 100 may be disposed to face the first surface 560a of the second substrate 560.

The second substrate 560 may be, e.g., a printed circuit board (PCB) or a ceramic substrate. In some embodiments, the second substrate 560 may function as an interposer. A first bump 141 and a second bump 142 may each be connected to the first surface 560a of the second substrate 560. A fifth bump 565 may be connected to a second surface 560b of the second substrate 560 that is opposed, e.g., opposite, to the first surface 560a of the second substrate 560. The fifth bump 565 may be a portion connected to an external device. The fifth bump 565 may include a conductive material.

A molding layer 580 may be disposed on the first surface 560a of the second substrate 560. The molding layer 580 may surround sidewalls of the semiconductor device shown in FIG. 1. An upper surface of the molding layer 580 may be formed at the same level as, e.g., on the same plane as, the second surface 100b of the first substrate 100. The molding layer 580 may include, e.g., an epoxy molding compound (EMC), or two or more kinds of silicon hybrid substances.

A semiconductor device according to some embodiments of the present disclosure will be described hereinafter with reference to FIG. 25. A description will be given focusing on differences relative to the semiconductor device shown in FIGS. 1 to 3.

Figure 25:
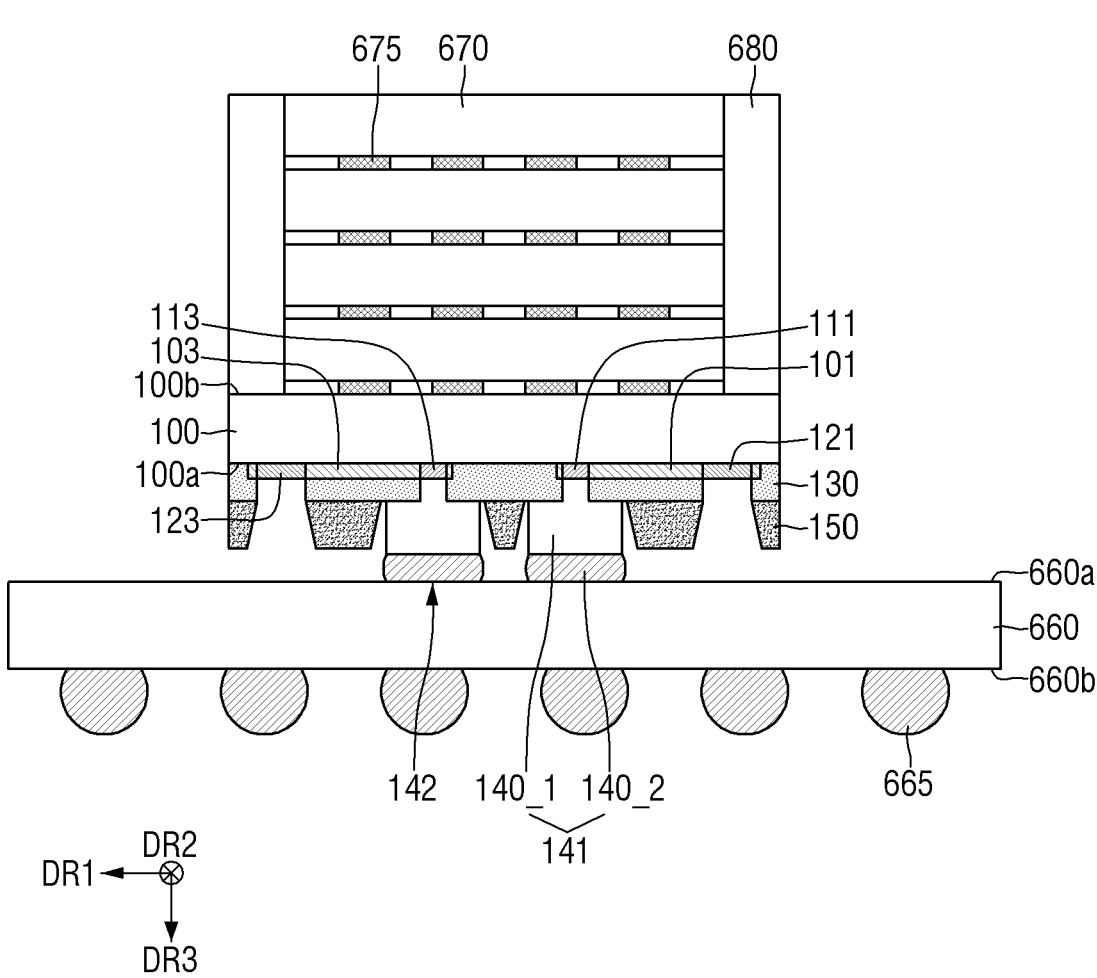
FIG. 25 is a cross-sectional view of a semiconductor device according to some embodiments of the present disclosure.

FIG. 25 is a cross-sectional view of a semiconductor device according to some embodiments of the present disclosure.

Referring to FIG. 25, in a semiconductor device according to some embodiments of the present disclosure, the semiconductor device shown in FIGS. 1 to 3 may be turned over and then disposed on a first surface 660a of a second substrate 660. That is, the first surface 100a of the first substrate 100 may be disposed to face the first surface 660a of the second substrate 660.

The first substrate 100 may be, e.g., an interposer. A first bump 141 and a second bump 142 may each be connected to the first surface 660a of the second substrate 660. A fifth bump 665 may be connected to a second surface 660b of the second substrate 660 that is opposed to the first surface 660a of the second substrate 660. The fifth bump 665 may be a portion connected to an external device. The fifth bump 665 may include a conductive material.

A plurality of semiconductor chips 670 may be stacked on the second surface 100b of the first substrate 100 in the vertical direction DR3. For example, the plurality of semiconductor chips may each be a volatile memory, e.g., a dynamic random access memory (DRAM) or a static random access memory (SRAM), or a non-volatile memory, e.g., a flash memory, a PRAM, an MRAM, a ferroelectric random access memory (FeRAM), or an RRAM.

A connection pad 675 may be disposed between each pair of adjacent semiconductor chips 670. In addition, the connection pad 675 may be disposed between the lowermost semiconductor chip among the plurality of semiconductor chips 670 and the second surface 100b of the first substrate 100. The first substrate 100 and each of the plurality of semiconductor chips 670 may be electrically connected to each other through the connection pad 675. The connection pad 675 may include a conductive material.

A molding layer 680 may be disposed on the second surface 100b of the first substrate 100. The molding layer 680 may surround sidewalls of each of the semiconductor chips 670. An upper surface of the molding layer 680 may be formed at the same level as, e.g., on the same plane as, the uppermost semiconductor chip among the plurality of semiconductor chips 670. However, the present disclosure is not limited thereto. The molding layer 680 may include, for example, an EMC or two or more kinds of silicon hybrid substances.

By way of summation and review, embodiments provide a semiconductor device which can effectively test the interface resistance and electrical connection between a bump and a bump pad at a wafer level before a sawing process by connecting one bump to two bump pads spaced apart from each other and electrically connecting the bump pads to a test pad.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed:

1. A semiconductor device, comprising:
   a first substrate including a first surface and a second surface, the first surface and the second surface being opposite to each other;
   a first test pad on the first surface of the first substrate;
   a first bump pad on the first surface of the first substrate, the first bump pad being spaced apart from the first test pad in a first horizontal direction;
   a second bump pad on the first surface of the first substrate, the second bump pad being spaced apart from the first bump pad;
   a second test pad on the first surface of the first substrate, the second test pad being spaced apart from the second bump pad in the first horizontal direction;
   a first wiring layer extending in the first horizontal direction and electrically connecting the first test pad to the first bump pad;
   a second wiring layer extending in the first horizontal direction and spaced apart from the first wiring layer, the second wiring layer electrically connecting the second test pad to the second bump pad; and
   a first bump connected to each of the first bump pad and the second bump pad.

2. The semiconductor device as claimed in claim 1, wherein:
   the second bump pad is spaced apart from the first bump pad in a second horizontal direction that is different from the first horizontal direction, and
   the second wiring layer is spaced apart from the first wiring layer in the second horizontal direction.

3. The semiconductor device as claimed in claim 2, further comprising:
   a third bump pad on the first surface of the first substrate and spaced apart from the first bump pad in the first horizontal direction;

a third test pad on the first surface of the first substrate and spaced apart from the third bump pad in the first horizontal direction;

a third wiring layer extending in the first horizontal direction, spaced apart from the first wiring layer in the first horizontal direction, and electrically connecting the third test pad to the third bump pad;

a fourth bump pad on the first surface of the first substrate and spaced apart from the third bump pad in the second horizontal direction;

a fourth test pad on the first surface of the first substrate and spaced apart from the fourth bump pad in the first horizontal direction;

a fourth wiring layer extending in the first horizontal direction, spaced apart from the third wiring layer in the second horizontal direction, and electrically connecting the fourth test pad to the fourth bump pad; and a second bump spaced apart from the first bump in the first horizontal direction and connected to each of the third and fourth bump pads.

4. The semiconductor device as claimed in claim 2, further comprising:

a third bump pad on the first surface of the first substrate and spaced apart from the first bump pad in the first horizontal direction;

a third test pad on the first surface of the first substrate and spaced apart from the third bump pad in the first horizontal direction;

a third wiring layer extending in the first horizontal direction, spaced apart from the first wiring layer in the first horizontal direction, and electrically connecting the third test pad to the third bump pad;

a fourth bump pad on the first surface of the first substrate and spaced apart from the third bump pad in the second horizontal direction;

a fourth test pad disposed on the first surface of the first substrate and spaced apart from the fourth bump pad in the first horizontal direction; and a fourth wiring layer extending in the first horizontal direction, spaced apart from the third wiring layer in the second horizontal direction, and electrically connecting the fourth test pad to the fourth bump pad, wherein the first bump is connected to each of the first to fourth bump pads.

5. The semiconductor device as claimed in claim 1, wherein:

the second bump pad is spaced apart from the first bump pad in the first horizontal direction, and the second wiring layer is spaced apart from the first wiring layer in the first horizontal direction.

6. The semiconductor device as claimed in claim 5, further comprising:

a third test pad on the first surface of the first substrate and spaced apart from the first test pad in a second horizontal direction that is different from the first horizontal direction;

a third bump pad on the first surface of the first substrate and spaced apart from the third test pad in the first horizontal direction;

a third wiring layer extending in the first horizontal direction, spaced apart from the first wiring layer in the second horizontal direction, and electrically connecting the third test pad to the third bump pad;

a fourth bump pad on the first surface of the first substrate and spaced apart from the third bump pad in the first horizontal direction;

a fourth test pad on the first surface of the first substrate and spaced apart from the fourth bump pad in the first horizontal direction;

a fourth wiring layer extending in the first horizontal direction, spaced apart from the third wiring layer in the first horizontal direction, and electrically connecting the fourth test pad to the fourth bump pad; and a second bump spaced apart from the first bump in the second horizontal direction and connected to each of the third and fourth bump pads.

7. The semiconductor device as claimed in claim 1, wherein each of the first wiring layer and the second wiring layer is on the first surface of the first substrate.

8. The semiconductor device as claimed in claim 7, wherein:

an upper surface of the first wiring layer is at a same level as each of an upper surface of the first test pad and an upper surface of the first bump pad, and an upper surface of the second wiring layer is at a same level as each of an upper surface of the second test pad and an upper surface of the second bump pad.

9. The semiconductor device as claimed in claim 1, wherein:

each of the first wiring layer and the second wiring layer is inside the first substrate, the first wiring layer overlaps each of the first test pad and the first bump pad in a vertical direction, and the second wiring layer overlaps each of the second test pad and the second bump pad in the vertical direction.

10. The semiconductor device as claimed in claim 1, wherein a width of the first test pad in the first horizontal direction is greater than a width of the first bump pad in the first horizontal direction.

11. The semiconductor device as claimed in claim 1, further comprising a second substrate on the first surface of the first substrate and connected to the first bump.

12. The semiconductor device as claimed in claim 11, further comprising a plurality of semiconductor chips stacked on the second surface of the first substrate in a vertical direction.

13. The semiconductor device as claimed in claim 1, wherein the first bump covers the entire upper surface of the first bump pad and the entire upper surface of the second bump pad.

14. The semiconductor device as claimed in claim 1, wherein each of the first bump pad and the second bump pad is defined by an opening in a passivation layer covering the first and second wiring layers.

15. A semiconductor device, comprising:

a substrate including a first surface and a second surface, the first surface and the second surface being opposite to each other;

first and second wiring layers extending in a first horizontal direction on the first surface of the substrate and spaced apart from each other;

a passivation layer covering the first and second wiring layers on the first surface of the substrate;

a first trench inside the passivation layer on the first wiring layer;

a second trench inside the passivation layer on the first wiring layer and spaced apart from the first trench in the first horizontal direction;

a third trench inside the passivation layer on the second wiring layer and spaced apart from the second trench;

a fourth trench inside the passivation layer on the second wiring layer and spaced apart from the third trench in the first horizontal direction;

a first test pad defined by a first portion of the first wiring layer exposed by the first trench;

a first bump pad defined by a second portion of the first wiring layer exposed by the second trench and connected to the first test pad through the first wiring layer;

a second bump pad defined by a first portion of the second wiring layer exposed by the third trench;

a second test pad defined by a second portion of the second wiring layer exposed by the fourth trench; and a first bump at least partially inside each of the second and third trenches and connected to each of the first and second bump pads, wherein the first bump pad and the first test pad are electrically connected to each other through the first wiring layer, and the second bump pad and the second test pad are electrically connected to each other through the second wiring layer.

16. The semiconductor device as claimed in claim 15, wherein:

the second bump pad is spaced apart from the first bump pad in a second horizontal direction that is different from the first horizontal direction, and the second wiring layer is spaced apart from the first wiring layer in the second horizontal direction.

17. The semiconductor device as claimed in claim 15, wherein:

the second bump pad is spaced apart from the first bump pad in the first horizontal direction, and the second wiring layer is spaced apart from the first wiring layer in the first horizontal direction.

18. The semiconductor device as claimed in claim 15, wherein each of the first wiring layer and the second wiring layer is on the first surface of the substrate.

19. The semiconductor device as claimed in claim 18, wherein:

an upper surface of the first wiring layer is at a same level as each of an upper surface of the first test pad and an upper surface of the first bump pad, and an upper surface of the second wiring layer is at a same level as each of an upper surface of the second test pad and an upper surface of the second bump pad.

20. The semiconductor device as claimed in claim 15, wherein:

each of the first wiring layer and the second wiring layer is inside the substrate, the first wiring layer overlaps each of the first test pad and the first bump pad in a vertical direction, and the second wiring layer overlaps each of the second test pad and the second bump pad in the vertical direction.

21. The semiconductor device as claimed in claim 15, further comprising a photosensitive layer surrounding sidewalls of the first bump on the passivation layer.

22. A semiconductor device, comprising:

a substrate including a first surface and a second surface, the first surface and the second surface being opposite to each other;

first and second wiring layers extending in a first horizontal direction on the first surface of the substrate and spaced apart from each other in a second horizontal direction that is different from the first horizontal direction;

a passivation layer covering the first and second wiring layers on the first surface of the substrate;

a first test pad inside the first wiring layer;

a first bump pad inside the first wiring layer and spaced apart from the first test pad in the first horizontal direction;

a second test pad inside the second wiring layer and spaced apart from the first test pad in the second horizontal direction;

a second bump pad inside the second wiring layer, spaced apart from the second test pad in the first horizontal direction, and spaced apart from the first bump pad in the second horizontal direction;

a bump connected to each of the first and second bump pads; and a photosensitive layer surrounding sidewalls of the bump on the passivation layer, wherein an upper surface of the first wiring layer is at a same level as each of an upper surface of the first test pad and an upper surface of the first bump pad, wherein an upper surface of the second wiring layer is at a same level as each of an upper surface of the second test pad and an upper surface of the second bump pad, wherein a width of the first test pad in the first horizontal direction is greater than a width of the first bump pad in the first horizontal direction, wherein the first bump pad and the first test pad are electrically connected to each other through the first wiring layer, and wherein the second bump pad and the second test pad are electrically connected to each other through the second wiring layer.

* * * * *